United States Patent
Kobayashi et al.

(10) Patent No.: US 9,893,283 B2
(45) Date of Patent: Feb. 13, 2018

(54) VAPOR DEPOSITION DEVICE, VAPOR DEPOSITION METHOD, AND ORGANIC ELECTROLUMINESCENCE ELEMENT MANUFACTURING METHOD

(71) Applicant: Sharp Kabushiki Kaisha, Osaka-shi (JP)

(72) Inventors: Yuhki Kobayashi, Osaka (JP); Katsuhiro Kikuchi, Osaka (JP); Shinichi Kawato, Osaka (JP); Takashi Ochi, Osaka (JP); Satoshi Inoue, Osaka (JP); Kazuki Matsunaga, Osaka (JP); Eiichi Matsumoto, Mitsuke (JP); Masahiro Ichihara, Mitsuke (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/102,132

(22) PCT Filed: Nov. 27, 2014

(86) PCT No.: PCT/JP2014/081339
§ 371 (c)(1),
(2) Date: Jun. 6, 2016

(87) PCT Pub. No.: WO2015/083600
PCT Pub. Date: Jun. 11, 2015

(65) Prior Publication Data
US 2016/0308131 A1  Oct. 20, 2016

(30) Foreign Application Priority Data

Dec. 6, 2013  (JP) .................................. 2013-253503

(51) Int. Cl.
*C23C 14/04* (2006.01)
*C23C 14/24* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
None
See application file for complete search history.

(56) References Cited

U.S. PATENT DOCUMENTS 8,257,799 B2 * 9/2012 Lee .................. C23C 16/06
427/255.28
2002/0011205 A1 * 1/2002 Yamazaki ............. C23C 14/564
118/620

(Continued)

FOREIGN PATENT DOCUMENTS

JP  2005-272969  10/2005
JP  2008-38224   2/2008
(Continued)

OTHER PUBLICATIONS

International Search Report dated Feb. 24, 2015, directed to International Application No. PCT/JP2014/081339; 2 pages.

*Primary Examiner* — Binu Thomas
(74) *Attorney, Agent, or Firm* — ScienBiziP, P.C.

(57) ABSTRACT

The present invention relates to a vapor deposition device for forming a film on a substrate, including: a vapor deposition chamber; a vapor deposition unit including a vapor deposition mask provided with an opening for pattern formation; and a transport mechanism that is configured to transfer at least one of the substrate and the vapor deposition unit relative to the other in a first direction perpendicular to the normal direction of the vapor deposition mask and that is configured to cause the substrate to rest temporarily at a resting position relative to the vapor deposition unit. The substrate includes a vapor-deposition-target region, and the region does not overlap the opening of the vapor deposition (Continued)

mask when the substrate is at the resting position. The vapor deposition chamber is provided with a first vent and a second vent.

20 Claims, 25 Drawing Sheets

(51) Int. Cl.
    *C23C 16/04*     (2006.01)
    *H01L 51/56*     (2006.01)
    *H01L 51/00*     (2006.01)
    *C23C 14/56*     (2006.01)
    *C23C 16/44*     (2006.01)
    *C23C 14/54*     (2006.01)
    *C23C 14/12*     (2006.01)
    *C23C 16/50*     (2006.01)

(52) U.S. Cl.
    CPC .............. *C23C 14/24* (2013.01); *C23C 14/54* (2013.01); *C23C 14/564* (2013.01); *C23C 16/042* (2013.01); *C23C 16/4412* (2013.01); *C23C 16/50* (2013.01); *H01L 51/001* (2013.01); *H01L 51/0012* (2013.01); *H01L 51/56* (2013.01); *H01L 2227/323* (2013.01); *H01L 2251/533* (2013.01)

(56) References Cited

U.S. PATENT DOCUMENTS

| | | | |
|---|---|---|---|
| 2004/0052972 A1* | 3/2004 | Schmitt | C23C 16/4412 118/715 |
| 2009/0017192 A1* | 1/2009 | Matsuura | C23C 14/042 118/718 |
| 2009/0246941 A1 | 10/2009 | Matsubayashi et al. | |
| 2013/0186335 A1* | 7/2013 | Kawato | C23C 14/042 118/720 |
| 2013/0273679 A1 | 10/2013 | Sonoda et al. | |
| 2013/0291796 A1* | 11/2013 | Inoue | C23C 14/243 118/720 |

FOREIGN PATENT DOCUMENTS

| | | | |
|---|---|---|---|
| JP | 2009-155680 | | 7/2009 |
| JP | 2014019942 | * | 2/2014 |
| WO | WO-2012/090777 | | 7/2012 |

* cited by examiner

VAPOR DEPOSITION DEVICE, VAPOR DEPOSITION METHOD, AND ORGANIC ELECTROLUMINESCENCE ELEMENT MANUFACTURING METHOD

CROSS-REFERENCE TO RELATED APPLICATIONS

This application is a U.S. National Phase patent application of International Patent Application No. PCT/JP2014/081339, filed on Nov. 27, 2014, which claims priority to Japanese Application No. 2013-253503, filed on Dec. 6, 2013, each of which is hereby incorporated by reference in the present disclosure in its entirety.

FIELD OF THE INVENTION

The present invention relates to vapor deposition devices, vapor deposition methods, and organic electroluminescence element (hereinafter, also referred to as organic EL element) manufacturing methods. The present invention specifically relates to a vapor deposition device, a vapor deposition method, and an organic electroluminescence element manufacturing method which are suitable for manufacturing organic EL elements on large-size substrates.

BACKGROUND OF THE INVENTION

Flat panel displays have been widely used in various products and fields in recent years, and the flat panel displays are required to have a larger size, a higher definition, and lower power consumption.

In this situation, organic EL devices, which include organic EL elements utilizing electroluminescence of organic materials, draw great attention as display devices for flat panel displays that are of solid state and are excellent in terms of low-voltage driving, rapid response, and self-luminousness.

The organic EL devices each include, for example, thin film transistors (TFTs) and organic EL elements connected to the TFTs on a substrate such as a glass substrate. The organic EL elements each have a stacked structure of a first electrode, an organic electroluminescence layer (hereinafter, also referred to as an organic EL layer), and a second electrode in the given order. The first electrode is connected to the corresponding TFT. The organic EL layer has a stacked structure of a hole-injection layer, a hole-transport layer, an electron-blocking layer, a light-emitting layer, a hole-blocking layer, an electron-transport layer, an electron-injection layer, and other layers.

Full-color organic EL devices generally have organic EL elements of three colors, i.e., red (R), green (G), and blue (B), as sub-pixels. These sub-pixels are arranged in a matrix, and three sub-pixels of the respective colors constitute one pixel. Then, these organic EL elements are selectively made to emit light at desired luminances, so that the display device shows an image.

In production of such an organic EL device, a pattern of the light-emitting layer is formed from a light-emitting material correspondingly to the organic EL elements (sub-pixels) of the respective colors.

Proposed examples of methods of forming a pattern of the light-emitting layer include vapor deposition with the substrate being in contact with a vapor deposition mask having a size similar to the substrate (hereinafter, also referred to as contact film formation); and vapor deposition on the whole substrate using a vapor deposition mask smaller than the substrate with the substrate being transferred (scanned) relative to the vapor deposition mask and a vapor deposition source (hereinafter, also referred to as scanning film formation) (for example, see Patent Literature 1).

Examples of vapor deposition devices to be used in formation of the organic EL layer include the following.

Patent Literature 2 discloses a film-forming device for forming a film on a substrate, including a first film-forming mechanism for forming a first layer and a second film-forming mechanism for forming a second layer inside a treatment container.

Patent Literature 3 discloses a vacuum film-forming device including a film-forming chamber configured to be in vacuo, a vapor deposition source disposed opposite to a substrate to be treated in the film-forming chamber, a gas inlet configured to introduce gas into the film-forming chamber, and a vent configured to discharge gas from the film-forming chamber, wherein the vent is positioned on a virtual line extended from the gas inlet in the gas-introducing direction and the virtual extended line crosses the central portion of a vapor deposition material stream from the vapor deposition source to the substrate to be treated.

Patent Literature 4 discloses a reduced-pressure vapor deposition device including a vapor deposition dish in a chamber, wherein, in formation of a vapor-deposited film, the atmospheric pressure for forming a vapor-deposited film is made to a gas pressure of the molecular flow region, and in at least a certain period of non-formation of a vapor-deposited film, the atmospheric pressure is made to a gas pressure of the viscous flow region.

CITATION LIST

Patent Literature 1: WO 2012/090777
Patent Literature 2: JP 2008-38224 A
Patent Literature 3: JP 2009-155680 A
Patent Literature 4: JP 2005-272969 A

SUMMARY OF THE INVENTION

In some cases, the luminance of an organic EL device produced by scanning film formation is disadvantageously lower than the luminance of an organic EL device produced by contact film formation. This is because, in the scanning film formation, the substrate needs to rest in a region outside the vapor deposition mask before and after the scanning and a contaminating matter (hereinafter, abbreviated as a contaminant) derived from the vapor-deposition material adheres to the resting substrate.

If a contaminant adheres to the substrate, the contaminant may possibly serve as a resistance of the organic EL element. In this case, a current flowing into the organic EL element is reduced, so that the luminance thereof is reduced. Further, the contaminant may possibly reduce the current efficiency of the organic EL element. In this case, the efficiency of converting the current into light is reduced, so that the luminance thereof is reduced. Thus, the contaminant may serve as a resistance of the organic EL element and/or may be a cause of a reduction in current efficiency.

The temporary rest of the substrate is performed for the purposes of waiting for stabilization of the vapor deposition rate and alignment, for example. Thus, such a rest causes a residence time and the substrate is in the state of being exposed to a contaminant for a relatively long time at the resting position.

The contaminant presumably floats in the whole vapor deposition chamber. Thus, the contaminant may possibly adhere to the substrate even when the substrate is transported, for example, when the substrate is transported from the substrate inlet to the resting position or when the substrate is transported from the resting position to the substrate outlet. However, the time of transporting the substrate is very short and the time being exposed to the contaminant is slight in comparison with the residence time at the resting position. Thus, the influence of the contaminant during transportation on a decrease in luminance is very smaller than the influence of the contaminant at the resting position.

Patent Literature documents 2 to 4 disclose techniques of lightening the influences of the contaminant and splash. Patent Literature 2 discloses avoidance of mutual contamination between different layers. However, as illustrated in FIG. 4 of Patent Literature 2, the substrate is scanned in such a manner as to be held integrally with a mask. Further, in Patent Literature 3, the paragraph discloses that a mask is disposed opposite to the film-forming-target surface of the substrate, and suggests an embodiment in which the substrate is scanned in such a manner as to be held integrally with a mask. Therefore, the techniques disclosed in Patent Literature documents 1 and 2 do not cause the aforementioned problems due to the contaminant in a region outside the vapor deposition mask. Patent Literature 4 does not refer to a vapor deposition mask at all.

Patent Literature documents 2 to 4 fail to disclose that the substrate is made to rest temporarily before and after the scanning in a region outside the vapor deposition mask. Thus, these documents do not recognize the influence of the contaminant at the resting position.

Therefore, the scanning film formation needs to be much improved in order to suppress the influence of the contaminant.

The present invention is devised in the aforementioned situation, and aims to provide a vapor deposition device, a vapor deposition method, and an organic electroluminescence element manufacturing method each of which can lighten the influence of the contaminant.

One aspect of the present invention may be a vapor deposition device for forming a film on a substrate, including:

a vapor deposition chamber;

a vapor deposition unit including a vapor deposition mask provided with an opening for pattern formation; and a transport mechanism that is configured to transfer at least one of the substrate and the vapor deposition unit relative to the other in a first direction perpendicular to the normal direction of the vapor deposition mask and that is configured to cause the substrate to rest temporarily at a resting position relative to the vapor deposition unit, the substrate including a vapor-deposition-target region, the region not overlapping the opening of the vapor deposition mask when the substrate is at the resting position, the vapor deposition chamber being provided with a first vent and a second vent, when the substrate is at the resting position, at least part of the second vent being positioned below the substrate in a view in a second direction that is perpendicular to the normal direction and the first direction.

Hereinafter, this vapor deposition device is also referred to as the vapor deposition device according to the present invention.

The following will describe preferred embodiments of the vapor deposition device according to the present invention. The following preferred embodiments may be appropriately combined. An embodiment achieved by combining any two or more of the following preferred embodiments is also one preferred embodiment.

The resting position may be a starting point or a finishing point of the transfer.

When the substrate is at the resting position, the substrate may not overlap the vapor deposition mask.

When the substrate is at the resting position, the vapor-deposition-target region of the substrate may overlap a non-opening region of the vapor deposition mask.

When the substrate is at the resting position, the second vent may face to a space adjacent to a vapor-deposition-target surface of the substrate.

The vapor deposition chamber may include a wall adjacent to the vapor deposition unit in the second direction,
the second vent may be provided in the wall.

The vapor deposition chamber may include the wall adjacent to the vapor deposition unit in the second direction,
the first vent may be provided in the wall,
the vapor deposition unit may include a vapor deposition source,
at least part of the first vent may be positioned above the vapor deposition source in a view in the second direction.

The vapor deposition source may include a nozzle,
the first vent may have a lower end positioned at the same height as or lower than the nozzle.

The lower end of the first vent may be positioned at the same height as a lower end of the vapor deposition source.

The vapor deposition unit may include a limiting plate,
the first vent may have an upper end positioned at the same height as or lower than an upper end of the limiting plate.

The vapor deposition unit may include a limiting plate,
the upper end of the first vent may be at the same height as a lower end of the limiting plate.

The vapor deposition device according to the present invention may include a plurality of the vapor deposition sources,
the first vent may have a width that is the same as or greater than the distance between a left end of a leftmost vapor deposition source among the vapor deposition sources and a right end of a rightmost vapor deposition source among the vapor deposition sources in a view in the second direction.

The vapor deposition device according to the present invention may include the plurality of the vapor deposition sources,
the vapor deposition sources may emit vapor deposition particles at different densities,
the width of the first vent may be the same as or greater than the distance between a left end and a right end of the vapor deposition source that emits the vapor deposition particles with the highest density among the vapor deposition sources in a view in the second direction.

When the substrate is at the resting position, the second vent may have a width that is not smaller than a width of the substrate in the first direction in a view in the second direction.

The second vent may be positioned apart from the vapor deposition mask in a view in the second direction.

The vapor deposition unit may include a mask frame that supports the vapor deposition mask,
the second vent may have a lower end positioned at the same height as a lower end of the mask frame.

The vapor deposition unit may include the mask frame that supports the vapor deposition mask, the space adjacent to the vapor-deposition-target surface may have a lower end positioned at the same height as the lower end of the mask frame.

The vapor deposition device according to the present invention may include a plurality of the second vents.

The vapor deposition device according to the present invention may include a plurality of the second vents, the vapor deposition chamber may include a wall adjacent to the vapor deposition unit in the second direction, the second vents may be provided in the wall, the number of the second vents provided may increase toward the lower side in a view in the second direction.

The vapor deposition device according to the present invention may include a plurality of the second vents, the second vents may have different sizes.

In this case, the vapor deposition unit may include a vapor deposition source, a greater vent among the second vents may be provided closer to the vapor deposition source and a smaller vent among the second vents may be provided farther from the vapor deposition source in a view in the second direction.

The vapor deposition chamber may be provided with a substrate inlet and a substrate outlet, when the substrate is at the resting position, the second vent may extend from below the substrate toward the substrate inlet or the substrate outlet in a view in the second direction.

The vapor deposition chamber may be provided with the substrate inlet, the substrate outlet, and a third vent, the third vent may be positioned between the second vent and the substrate inlet or the substrate outlet in a view in the second direction.

The resting position may be a first resting position, the transport mechanism may cause the substrate to rest temporarily relative to the vapor deposition unit at a second resting position, when the substrate is at the second resting position, the vapor-deposition-target region of the substrate may not overlap the opening of the vapor deposition mask, the first resting position may be positioned at one side of the vapor deposition mask, the second resting position may be positioned at the other side of the vapor deposition mask, the vapor deposition unit may include the vapor deposition source, the vapor deposition source may include a nozzle provided with an injection port, the nozzle may be inclined toward the substrate at the first resting position, when the substrate is at the second resting position, no second vent may be provided below the substrate in a view in the second direction.

The vapor deposition chamber may include the substrate inlet, the substrate outlet, and the third vent, at least part of the third vent may be positioned below the substrate inlet or the substrate outlet.

The vapor deposition device according to the present invention may include an anti-adhesion plate, when the substrate is at the resting position, at least part of a vapor-deposition-target surface of the substrate may be opposite to the anti-adhesion plate.

The vapor deposition device according to the present invention may include a plurality of the anti-adhesion plates, the anti-adhesion plates may define a gap therebetween, at least part of the second vent may be positioned below or above the gap in a view in the second direction.

The vapor deposition unit may include a mask frame that supports the vapor deposition mask, the mask frame may be disposed so as to define a gap with the anti-adhesion plate, the vapor deposition chamber may be provided with a third vent, at least part of the third vent may be positioned below or above the gap in a view in the second direction.

The vapor deposition unit may include the mask frame that supports the vapor deposition mask, the mask frame may be disposed so as to define a gap with the anti-adhesion plate, at least part of the second vent may be positioned below or above the gap in a view in the second direction.

The vapor deposition chamber may include a protrusion that protrudes from part of the wall, the vapor deposition chamber may be provided with a substrate inlet and a substrate outlet, the protrusion may extend from below the substrate inlet or the substrate outlet to the vicinity of the vapor deposition mask, when the substrate is at the resting position, at least part of the vapor-deposition-target surface of the substrate may be opposite to the protrusion, the second vent may be provided in a surface that is a surface of the protrusion and is opposite to the vapor-deposition-target surface of the substrate at the resting position.

The protrusion may be the same size as the substrate or may be greater than the substrate.

When the substrate is at the resting position, the protrusion may overlap the whole substrate.

The second vent provided in the surface of the protrusion may be the same size as the substrate or may be greater than the substrate.

When the substrate is at the resting position, the second vent provided in the surface of the protrusion may overlap the whole substrate.

The second vent provided in the surface of the protrusion may be the same size as the vapor-deposition-target region of the substrate.

When the substrate is at the resting position, the second vent provided in the surface of the protrusion may be disposed correspondingly to the vapor-deposition-target region of the substrate.

The surface of the protrusion may include the plurality of the second vents, the substrate may include a plurality of the vapor-deposition-target regions, the second vents may be provided correspondingly to the vapor-deposition-target regions.

A distance between the protrusion and the substrate at the resting position may be smaller than a distance between the protrusion and the substrate passing through the substrate inlet or the substrate outlet.

The vapor deposition chamber may include the protrusion that is protruded from part of the wall, the vapor deposition chamber may be provided with the substrate inlet and the substrate outlet, the protrusion may extend from below the substrate inlet or the substrate outlet to the vicinity of the vapor deposition mask, when the substrate is at the resting position, at least part of the vapor-deposition-target surface of the substrate may be opposite to the protrusion, the second vent may be provided in the wall of the vapor deposition chamber.

The vapor deposition chamber may include the protrusion that protrudes from part of the wall, the vapor deposition chamber may be provided with the substrate inlet and the substrate outlet, the protrusion may extend from below the substrate inlet or the substrate outlet to the vicinity of the vapor deposition mask, when the substrate is at the resting position, at least part of the vapor-deposition-target surface of the substrate may be opposite to the protrusion, the vapor deposition unit may include the mask frame that supports the vapor deposition mask, the mask frame may be disposed so as to define a gap with the protrusion, the vapor deposition chamber may be provided with the third vent, at least part of the third vent may be positioned below or above the gap in a view in the second direction.

When the substrate is at the resting position, the second vent may have an upper end that overlaps the substrate or that is positioned above the substrate in a view in the second direction.

The vapor deposition chamber may be provided with a third vent, the third vent may be positioned higher than the substrate at the resting position.

Another aspect of the present invention may be a vapor deposition method including a vapor deposition step of forming a thin film pattern on a substrate, the vapor deposition step being performed using the vapor deposition device according to the present invention.

Still another aspect of the present invention may be an organic electroluminescence element manufacturing method including a vapor deposition step of forming a thin film pattern using the vapor deposition device according to the present invention.

The present invention can achieve a vapor deposition device, a vapor deposition method, and an organic electroluminescence element manufacturing method each of which can lighten the influence of a contaminant.

DETAILED DESCRIPTION OF THE INVENTION

Figure 1:
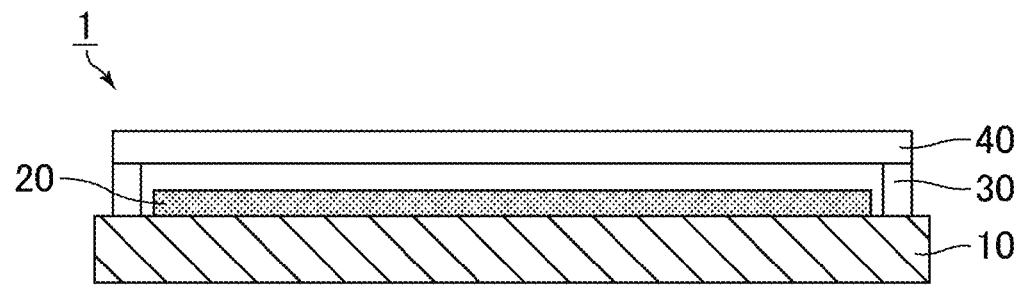
FIG. 1 is a schematic cross-sectional view of an organic EL display device including an organic EL element manufactured by an organic EL element manufacturing method of Embodiment 1.

The present invention will be mentioned in more detail referring to the drawings in the following embodiments, but is not limited to these embodiments.

The following embodiments will be described appropriately with the Cartesian coordinate system consisting of the X axis and the Y axis in the horizontal plane and the Z axis in the vertical direction. In the following Embodiments 1 to 3, the X-axis direction, the Y-axis direction, and the Z-axis direction respectively correspond to the second direction, the first direction, and the normal direction of a vapor deposition mask in the vapor deposition device according to the present invention.

The present embodiment mainly describes a method of manufacturing an RGB full-color organic EL element of a bottom-emission type in which light is emitted from the TFT substrate side, and an organic EL display device including the organic EL element manufactured by this manufacturing method. The present embodiment may be applicable to other organic EL element manufacturing methods.

First, the whole structure of the organic EL display device of the present embodiment is described.

Figure 2:
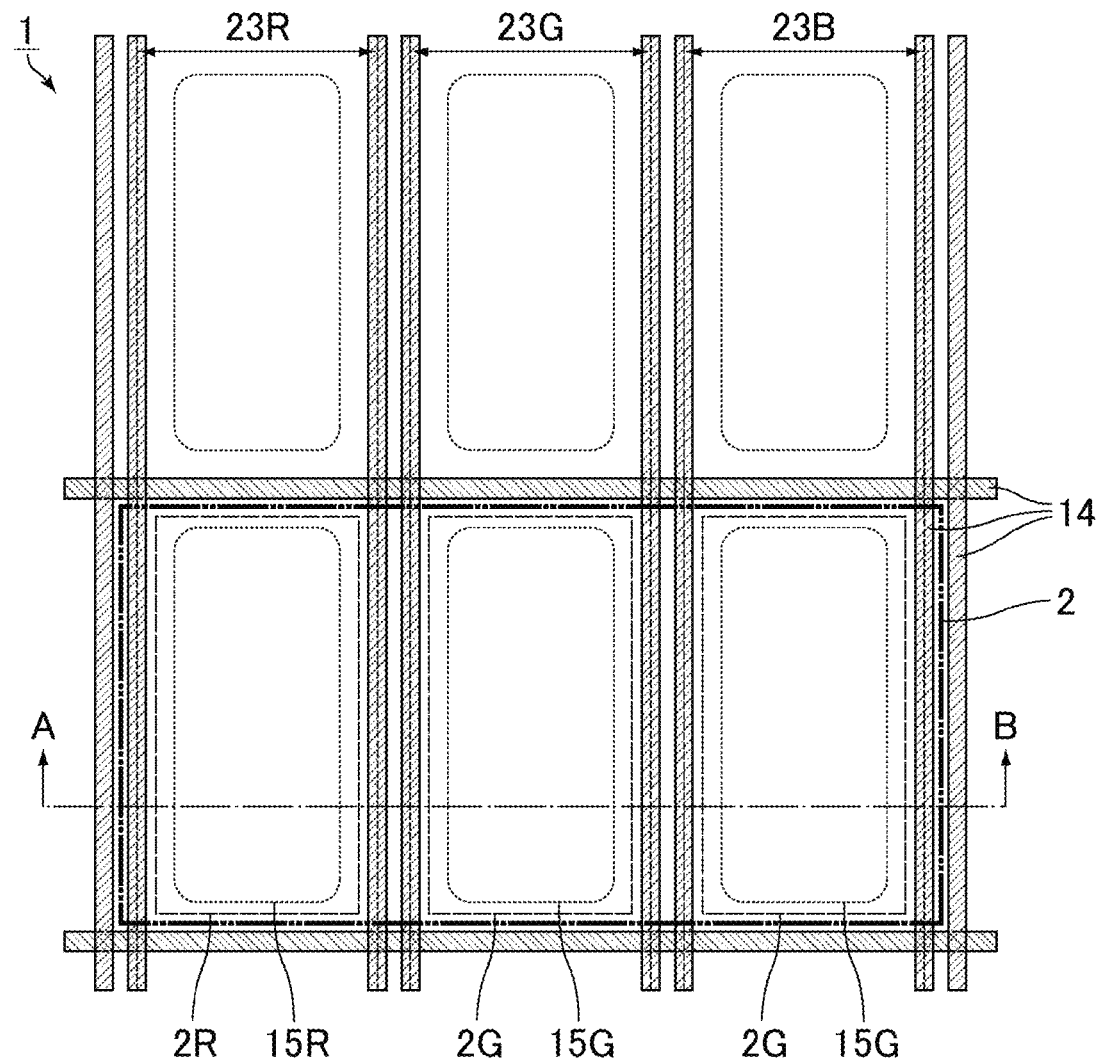
FIG. 2 is a schematic plan view of a structure in a display region of the organic EL display device illustrated in FIG. 1.
Figure 3:
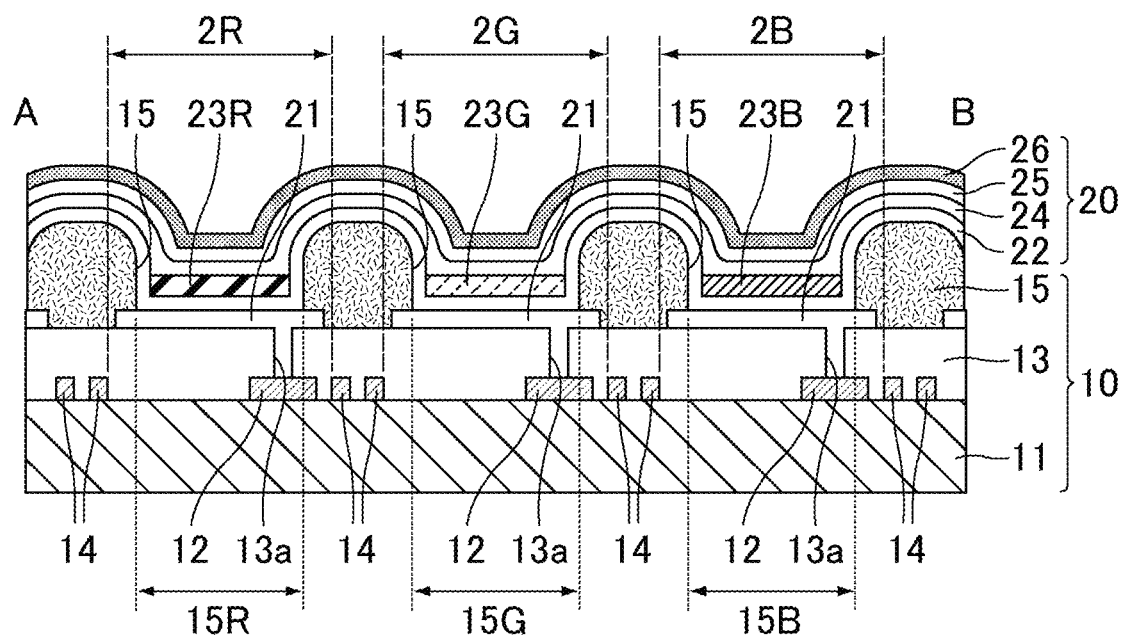
FIG. 3 is a schematic cross-sectional view of a TFT substrate of the organic EL display device illustrated in FIG. 1 taken along the A-B line in FIG. 2.

FIG. 1 is a schematic cross-sectional view of an organic EL display device including an organic EL element manufactured by an organic EL element manufacturing method of Embodiment 1. FIG. 2 is a schematic plan view of a structure in a display region of the organic EL display device illustrated in FIG. 1. FIG. 3 is a schematic cross-sectional view of a TFT substrate of the organic EL display device illustrated in FIG. 1 taken along the A-B line in FIG. 2.

As illustrated in FIG. 1, an organic EL display device 1 of the present embodiment includes a TFT substrate 10 provided with TFTs 12 (see FIG. 3), organic EL elements 20 disposed on the TFT substrate 10 and connected to the TFTs 12, a frame-like adhesive layer 30 provided so as to surround the organic EL elements 20, and a sealing substrate 40 disposed so as to cover the organic EL elements 20. The adhesive layer 30 bonds the peripheral portion of the TFT substrate 10 and the peripheral portion of the sealing substrate 40.

Bonding of the sealing substrate 40 and the TFT substrate 10 with the organic EL element 20 stacked thereon using the adhesive layer 30 results in an enclosure of the organic EL elements 20 between the pair of the substrates 10 and 40. Thereby, oxygen and moisture are prevented from entering the organic EL elements 20.

As illustrated in FIG. 3, the TFT substrate 10 includes a transparent insulating substrate 11, such as a glass substrate, as a supporting substrate. As illustrated in FIG. 2, multiple conductive lines 14 are disposed on the insulating substrate 11, and the conductive lines 14 include multiple gate lines arranged in the horizontal direction and multiple signal lines arranged in the vertical direction, i.e., crossing the gate lines. The gate lines are connected with gate-line-driving circuits (not illustrated) for driving the gate lines, and the signal lines are connected with signal-line-driving circuits (not illustrated) for driving the signal lines.

The organic EL display device 1 is an active-matrix RGB full-color display device. Each region defined by the conductive lines 14 is provided with a red (R), green (G), or blue (B) sub-pixel (dot) 2R, 2G, or 2B. The sub-pixels 2R, 2G, and 2B are arranged in a matrix. Each of the sub-pixels 2R, 2G, and 2B is provided with an organic EL element 20 of the corresponding color and a light-emitting region.

The red, green, and blue sub-pixels 2R, 2G, and 2B respectively emit red light, green light, and blue light, and the three sub-pixels 2R, 2G, and 2B constitute one pixel 2.

The sub-pixels 2R, 2G, and 2B are respectively provided with openings 15R, 15G, and 15B, and the openings 15R, 15G, and 15B are respectively covered with red, green, and blue light-emitting layers 23R, 23G, and 23B. The light-emitting layers 23R, 23G, and 23B are arranged in stripes in the vertical direction. The patterns of the light-emitting layers 23R, 23G, and 23B are formed by vapor deposition for the respective colors. The openings 15R, 15G, and 15B will be described later.

The sub-pixels 2R, 2G, and 2B are provided with the TFTs 12 that are connected to first electrodes 21 of the organic EL element 20. The luminous intensities of the sub-pixels 2R, 2G, and 2B are determined by scanning and selection by the conductive lines 14 and the TFTs 12. Thus, the organic EL display device 1 achieves image display by selectively causing the organic EL elements 20 of the respective colors to emit light with desired luminances using the TFTs 12.

Next, the structures of the TFT substrate 10 and the organic EL element 20 are described in detail. The TFT substrate 10 is first described.

As illustrated in FIG. 3, the TFT substrate 10 includes the TFTs (switching elements) 12 and the conductive lines 14 disposed on the insulating substrate 11, an interlayer film (interlayer insulation layer, flattening layer) 13 covering these elements, and an edge cover 15, serving as an insulating layer, disposed on the interlayer film 13.

The TFTs 12 are disposed correspondingly to the sub-pixels 2R, 2G, and 2B. The TFTs 12 may have a usual structure, and thus the respective layers of the TFTs 12 are not illustrated and described herein.

The interlayer film 13 is disposed on the entire region of the insulating substrate 11. The first electrodes 21 of the organic EL element 20 are disposed on the interlayer film 13. The interlayer film 13 is provided with contact holes 13a that electrically connect the first electrodes 21 to the TFTs 12. Thereby, the TFTs 12 are electrically connected to the organic EL element 20 through the contact holes 13a.

The edge cover 15 is disposed so as to prevent short circuits between the first electrodes 21 and the second electrode 26 of the organic EL element 20 due to thinning of an organic EL layer or occurrence of electric field concentration at edge portions of the first electrodes 21. Thus, the edge cover 15 is disposed so as to partially cover edge portions of the first electrodes 21.

The edge cover 15 is provided with the aforementioned openings 15R, 15G, and 15B. These openings 15R, 15G, and 15B of the edge cover 15 respectively serve as light-emitting regions of the sub-pixels 2R, 2G, and 2B. In other words, the sub-pixels 2R, 2G, and 2B are divided by the edge cover 15 having an insulating ability. The edge cover 15 also serves as an element-separating film.

Next, the organic EL element 20 is described.

The organic EL element 20 is a light-emitting element that can emit light with a high luminance by a low-voltage DC driving, and includes the first electrodes 21, organic EL layers, and the second electrode 26 stacked in the given order.

The first electrodes 21 are layers that have a function of injecting (supplying) holes into an organic EL layer. The first electrodes 21 are connected to the TFTs 12 through the contact holes 13a as mentioned above.

As illustrated in FIG. 3, between the first electrodes 21 and the second electrode 26 are stacked, in the given order from the first electrodes 21 side, a hole-injection/hole-transport layer 22, a light-emitting layer 23R, 23G, or 23B, an electron-transport layer 24, and an electron-injection layer 25, as organic EL layers.

This stacking order is applied to the case where the first electrodes 21 are anodes and the second electrode 26 is a cathode. In the case where the first electrodes 21 are cathodes and the second electrode 26 is an anode, the order of stacking the organic EL layers is reversed.

The hole-injection layer is a layer that has a function of improving the efficiency of injecting holes into the light-emitting layers 23R, 23G, and 23B. The hole-transport layer is a layer that has a function of improving the efficiency of transporting holes into the light-emitting layers 23R, 23G, and 23B. The hole-injection/hole-transport layer 22 is uniformly disposed in the entire display region of the TFT substrate 10 so as to cover the first electrodes 21 and the edge cover 15.

The present embodiment exemplifies the case of disposing, as a hole-injection layer and a hole-transport layer, a hole-injection/hole-transport layer 22 that is an integrated layer of a hole-injection layer and a hole-transport layer, as mentioned above. Still, the present embodiment should not be limited to this case. The hole-injection layer and the hole-transport layer may be disposed as distinct layers.

On the hole-injection/hole-transport layer 22 are disposed light-emitting layers 23R, 23G, and 23B so as to cover the openings 15R, 15G, and 15B of the edge cover 15 correspondingly to the sub-pixels 2R, 2G, and 2B.

The light-emitting layers 23R, 23G, and 23B are layers that have a function of recombining holes injected from the first electrodes 21 side and electrons injected from the second electrode 26 side to emit light. The light-emitting layers 23R, 23G, and 23B are each formed from a material having high light-emitting efficiency, such as a low molecular weight luminescent pigment or a metal complex.

The electron-transport layer 24 is a layer that has a function of improving the efficiency of transporting electrons from the second electrode 26 to the light-emitting layers 23R, 23G, and 23B. The electron-injection layer 25 is a layer that has a function of improving the efficiency of injecting electrons from the second electrode 26 to the light-emitting layers 23R, 23G, and 23B.

The electron-transport layer 24 is uniformly disposed in the entire display region of the TFT substrate 10 so as to cover the light-emitting layers 23R, 23G, and 23B and the hole-injection/hole-transport layer 22. The electron-injection layer 25 is uniformly disposed in the entire display region of the TFT substrate 10 so as to cover the electron-transport layer 24.

The electron-transport layer 24 and the electron-injection layer 25 may be disposed as distinct layers as mentioned above, or may be disposed in an integrated manner. In other words, the organic EL display device 1 may include an electron-transport/electron-injection layer instead of the electron-transport layer 24 and the electron-injection layer 25.

The second electrode 26 is a layer that has a function of injecting electrons into an organic EL layer. The second electrode 26 is uniformly disposed in the entire display region of the TFT substrate 10 so as to cover the electron-injection layer 25.

The organic layers other than the light-emitting layers 23R, 23G, and 23B are not essential layers for the organic EL layers, and may be appropriately disposed in accordance with the properties required for the organic EL element 20. The organic EL layers may additionally include a carrier-blocking layer, if necessary. For example, a hole-blocking layer may be disposed between the group of the light-emitting layers 23R, 23G, and 23B and the electron-transport layer 24 as a carrier-blocking layer. This suppresses arrival of holes to the electron-transport layer 24, improving the light-emitting efficiency.

The organic EL element 20 may have any of the following layered structures (1) to (8), for example.

(1) First electrode/light-emitting layer/second electrode (2) First electrode/hole-transport layer/light-emitting layer/electron-transport layer/second electrode (3) First electrode/hole-transport layer/light-emitting layer/hole-blocking layer/electron-transport layer/second electrode (4) First electrode/hole-transport layer/light-emitting layer/hole-blocking layer/electron-transport layer/electron-injection layer/second electrode (5) First electrode/hole-injection layer/hole-transport layer/light-emitting layer/electron-transport layer/electron-injection layer/second electrode (6) First electrode/hole-injection layer/hole-transport layer/light-emitting layer/hole-blocking layer/electron-transport layer/second electrode (7) First electrode/hole-injection layer/hole-transport layer/light-emitting layer/hole-blocking layer/electron-transport layer/electron-injection layer/second electrode (8) First electrode/hole-injection layer/hole-transport layer/electron-blocking layer (carrier-blocking layer)/light-emitting layer/hole-blocking layer/electron-transport layer/electron-injection layer/second electrode As mentioned above, the hole-injection layer and the hole-transport layer may be integrated with each other. The electron-transport layer and the electron-injection layer may be integrated with each other.

The structure of the organic EL element 20 is not limited to the layered structures (1) to (8), and may have any desired layered structure in accordance with the properties required for the organic EL element 20.

Next, a method of manufacturing the organic EL display device 1 is described.

Figure 4:
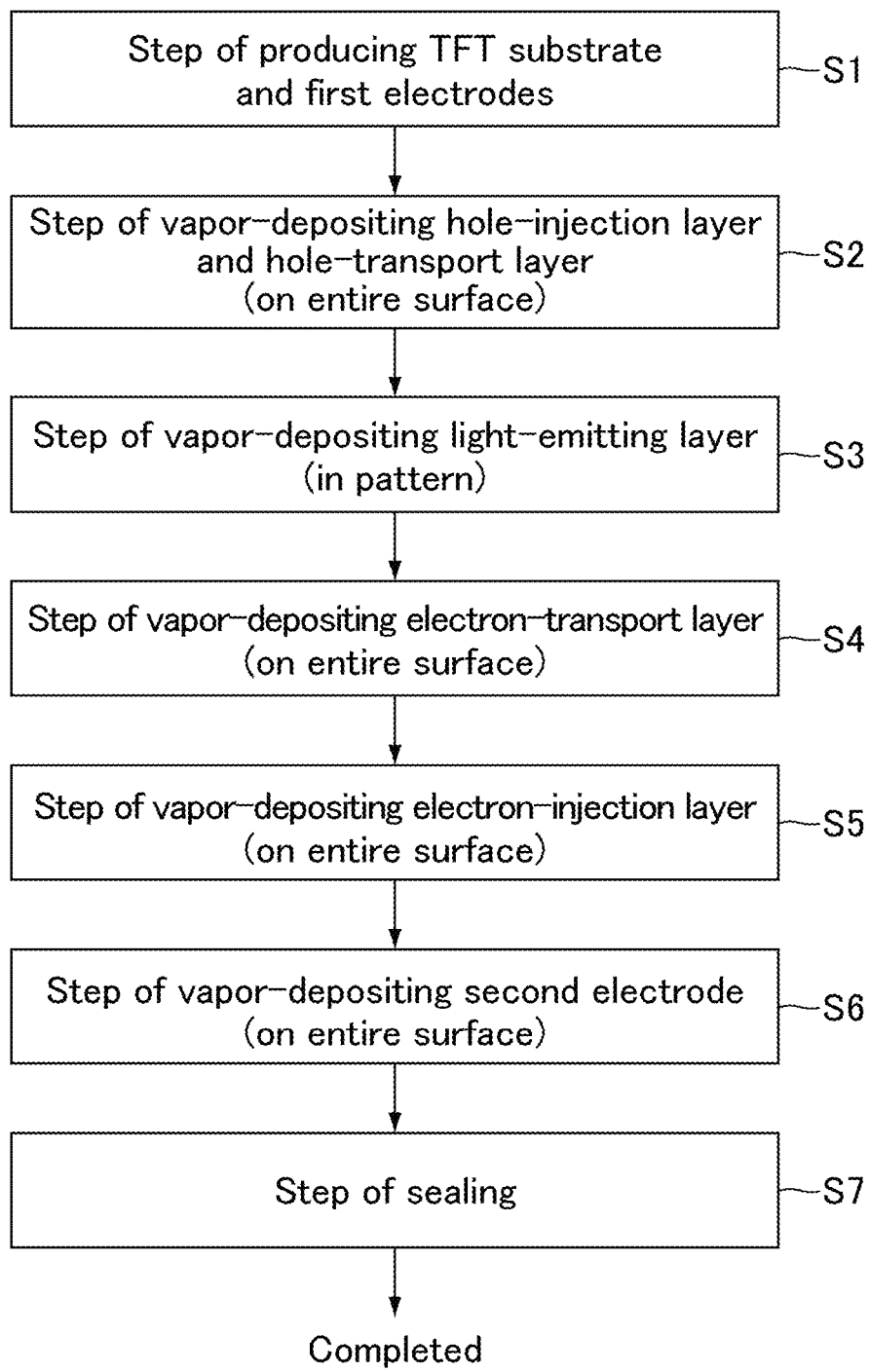
FIG. 4 is a flow chart of the steps of manufacturing the organic EL display device of Embodiment 1.

FIG. 4 is a flow chart of the steps of manufacturing the organic EL display device of Embodiment 1.

As illustrated in FIG. 4, the method of manufacturing the organic EL display device according to the present embodiment includes, for example, a step S1 of producing a TFT substrate and first electrodes; a step S2 of vapor-depositing a hole-injection layer and a hole-transport layer; a step S3 of vapor-depositing a light-emitting layer; a step S4 of vapor-depositing an electron-transport layer; a step S5 of vapor-depositing an electron-injection layer; a step S6 of vapor-depositing a second electrode; and a step S7 of sealing.

Based on the flow chart illustrated in FIG. 4, the steps of producing the respective elements described with reference to FIG. 1 and FIG. 3 are described hereinbelow. The dimensions, materials, shapes, and others of the elements described in the present embodiment are mere examples, and the scope of the present invention is not limited by these examples.

Also, as mentioned above, the stacking order described in the present embodiment is applied to the case where the first electrodes 21 are anodes and the second electrode 26 is a cathode. In the case where the first electrodes 21 are cathodes and the second electrode 26 is an anode, the stacking order of the organic EL layers is reversed. Similarly, the materials constituting the first electrodes 21 and the second electrode 26 are switched.

As illustrated in FIG. 3, a photosensitive resin is applied to the insulating substrate 11 with the components such as the TFTs 12 and the conductive lines 14 disposed thereon by a usual method, and the applied resin is patterned by photolithography. Thereby, the interlayer film 13 is formed on the insulating substrate 11.

The insulating substrate 11 may be a glass substrate or a plastic substrate having a thickness of 0.7 to 1.1 mm, a length in the Y-axis direction (vertical length) of 400 to 500 mm, and a length in the X-axis direction (lateral length) of 300 to 400 mm, for example.

The interlayer film 13 may be formed from a resin such as acrylic resin or polyimide resin. Examples of the acrylic resin include Optmer series (JSR Corp.). Examples of the polyimide resin include Photoneece series (Toray Industries, Inc.). It should be noted that the polyimide resin is usually not transparent but colored. Thus, in the case of producing a bottom-emission organic EL display device as the organic EL display device 1 as illustrated in FIG. 3, the interlayer film 13 is more preferably formed from a transparent resin such as acrylic resin.

The interlayer film 13 may have any thickness that can compensate the steps formed by the TFTs 12. For example, the thickness may be about 2 μm.

Next, the contact holes 13*a* that electrically connect the first electrodes 21 to the TFTs 12 are formed in the interlayer film 13.

Next, a conductive film (electrode film), such as an indium-tin-oxide (ITO) film, is formed by sputtering so as to have a thickness of 100 nm.

Next, a photo resist is applied to the ITO film and patterned by photolithography, and the ITO film is etched with ferric chloride used as an etchant. Then, the photo resist is separated using a resist-stripping liquid, and the substrate is washed. Thereby, the first electrodes 21 arranged in a matrix are formed on the interlayer film 13.

Examples of the conductive film material used for the first electrodes 21 include transparent conductive materials such as ITO, indium zinc oxide (IZO), and gallium-doped zinc oxide (GZO); and metal materials such as gold (Au), nickel (Ni), and platinum (Pt).

Instead of the sputtering, the conductive film may be stacked by vacuum evaporation, chemical vapor deposition (CVD), plasma CVD, printing, or the like.

The first electrodes 21 each may have any thickness, and the thickness may be 100 nm, for example, as mentioned above.

Next, the edge cover 15 is formed such that it has a thickness of, for example, about 1 μm in the same manner as the interlayer film 13. The edge cover 15 may be formed from the same insulating material as the material of the interlayer film 13.

The TFT substrate 10 and the first electrodes 21 are produced by the aforementioned step (S1).

Then, the TFT substrate 10 after the above step is subjected to reduced-pressure baking for desiccation and oxygen plasma treatment for washing of the surfaces of the first electrodes 21.

Next, a hole-injection layer and a hole-transport layer (in the present embodiment, the hole-injection/hole-transport layer 22) are vapor-deposited in the entire display region of the TFT substrate 10 using a usual vapor deposition device (S2).

Specifically, an open mask provided with an opening corresponding to the entire display region is aligned with the TFT substrate 10 and closely bonded thereto. Then, vapor deposition particles scattered from a vapor deposition source are uniformly vapor-deposited in the entire display region through the opening of the open mask while the TFT substrate 10 and the open mask are rotated together.

The vapor deposition in the entire display region means continuous vapor deposition on adjacent sub-pixels of different colors without gaps.

Examples of the materials of the hole-injection layer and the hole-transport layer include benzine, styrylamine, triphenylamine, porphyrins, triazole, imidazole, oxadiazole, polyarylalkanes, phenylenediamine, arylamines, oxazole, anthracene, fluorenone, hydrazones, stilbene, triphenylene, azatriphenylene, and derivatives thereof; polysilane compounds; vinyl carbazole compounds; and heterocyclic conjugated monomers, oligomers, or polymers such as thiophene compounds and aniline compounds.

The hole-injection layer and the hole-transport layer may be integrated with each other as mentioned above, or may be disposed as distinct layers. The thickness of each layer is 10 to 100 nm, for example.

In the case of forming the hole-injection/hole-transport layer 22 as a hole-injection layer and a hole-transport layer, the material of the hole-injection/hole-transport layer 22 may be 4,4'-bis[N-(1-naphthyl)-N-phenylamino]biphenyl (α-NPD), for example. The hole-injection/hole-transport layer 22 may have a thickness of 30 nm, for example.

Next, the light-emitting layers 23R, 23G, and 23B are separately formed (patterned) on the hole-injection/hole-transport layer 22 so as to cover the openings 15R, 15G, and 15B of the edge cover 15 correspondingly to the sub-pixels 2R, 2G, and 2B (S3).

As mentioned above, the light-emitting layers 23R, 23G, and 23B are each formed from a material having high light-emitting efficiency, such as a low molecular weight luminescent pigment or a metal complex.

Examples of the material of the light-emitting layers 23R, 23G, and 23B include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and derivatives thereof; tris(8-quinolinolato) aluminum complexes; bis(benzoquinolinolato)beryllium complexes; tri(dibenzoylmethyl)phenanthroline europium complexes; and ditolylvinyl biphenyl.

The light-emitting layers 23R, 23G, and 23B each may have a thickness of 10 to 100 nm, for example.

The manufacturing method according to the present invention can be particularly suitably used for formation of such light-emitting layers 23R, 23G, and 23B.

A method of forming patterns of the light-emitting layers 23R, 23G, and 23B utilizing the manufacturing method according to the present invention will be mentioned later.

Next, in the same manner as in the step S2 of vapor-depositing a hole-injection layer and a hole-transport layer, the electron-transport layer 24 is vapor-deposited in the entire display region of the TFT substrate 10 so as to cover the hole-injection/hole-transport layer 22 and the light-emitting layers 23R, 23G, and 23B (S4).

Then, in the same manner as in the step S2 of vapor-depositing a hole-injection layer and a hole-transport layer, the electron-injection layer 25 is vapor-deposited in the entire display region of the TFT substrate 10 so as to cover the electron-transport layer 24 (S5).

Examples of the materials of the electron-transport layer 24 and the electron-injection layer 25 include quinoline, perylene, phenanthroline, bisstyryl, pyrazine, triazole, oxazole, oxadiazole, fluorenone, and derivatives and metal complexes thereof; and lithium fluoride (LiF).

Specific examples thereof include tris(8-hydroxyquinoline)aluminum (Alq$_3$), anthracene, naphthalene, phenanthrene, pyrene, anthracene, perylene, butadiene, coumarin, acridine, stilbene, 1,10-phenanthroline, and derivatives and metal complexes thereof; and LiF.

As mentioned above, the electron-transport layer 24 and the electron-injection layer 25 may be disposed in an integrated manner or as distinct layers. The thickness of each layer may be, for example, 1 to 100 nm, preferably 10 to 100 nm. The sum of the thicknesses of the electron-transport layer 24 and the electron-injection layer 25 may be, for example, 20 to 200 nm.

Typically, the material of the electron-transport layer 24 is Alq$_3$ and the material of the electron-injection layer 25 is LiF. For example, the electron-transport layer 24 has a thickness of 30 nm and the electron-injection layer 25 has a thickness of 1 nm.

Next, in the same manner as in the step (S2) of vapor-depositing a hole-injection layer and a hole-transport layer, the second electrode 26 is vapor-deposited in the entire display region of the TFT substrate 10 so as to cover the electron-injection layer 25 (S6). As a result, the organic EL element 20 including the organic EL layers, the first electrodes 21, and the second electrode 26 is formed on the TFT substrate 10.

The material (electrode material) of the second electrode 26 may be suitably a metal having a low work function. Examples of such an electrode material include magnesium alloys (e.g., MgAg), aluminum alloys (e.g., AlLi, AlCa, AlMg), and metallic calcium. The second electrode 26 may have a thickness of 50 to 100 nm, for example.

Typically, the second electrode 26 is formed from a 50-nm-thick aluminum film.

Next, as illustrated in FIG. 1, the TFT substrate 10 including the organic EL element 20 disposed thereon and a sealing substrate 40 are bonded to each other with the adhesive layer 30, so that the organic EL element 20 is enclosed therein.

The material of the adhesive layer 30 may be, for example, a sealing resin or fritted glass. The sealing substrate 40 may be an insulating substrate, such as a glass substrate or a plastic substrate, having a thickness of 0.4 to 1.1 mm. The sealing substrate 40 may be engraved glass.

The vertical length and lateral length of the sealing substrate 40 may be appropriately adjusted in accordance with the target size of the organic EL display device 1. For example, an insulating substrate having substantially the same size as the insulating substrate 11 of the TFT substrate 10 may be used for enclosing the organic EL element 20, and then the workpiece may be cut in accordance with the target size of the organic EL display device 1.

The method of enclosing the organic EL element 20 should not be limited to the aforementioned method, and any other enclosing methods may be applied. One example of the enclosing technique is a method of filling the space between the TFT substrate 10 and the sealing substrate 40 with resin.

In order to prevent oxygen and moisture from entering the organic EL element 20 from the outside, a protection film (not illustrated) may be disposed on the second electrode 26 so as to cover the second electrode 26.

The protection film may be formed from an insulating or conductive material. Examples of such a material include silicon nitride and silicon oxide. The protection film may have a thickness of 100 to 1000 nm, for example.

As the result of these steps, the organic EL display device 1 is completed.

In this organic EL display device 1, when the TFT 12 receives a signal from the conductive line 14 and is turned on, a hole is injected from the first electrode 21 into an organic EL layer. Also, an electron is injected from the second electrode 26 into an organic EL layer, and the hole and the electron are recombined in the corresponding light-emitting layer 23R, 23G, or 23B. The energy generated by the recombination of the hole and the electron excites the light-emitting material. When this excited state is returned to the ground state, light is emitted. A desired image is displayed by controlling the light-emitting luminances of the respective sub-pixels 2R, 2G, and 2B.

Next, the step S3 of vapor-depositing a light-emitting layer and the vapor deposition device is described.

Figure 5:
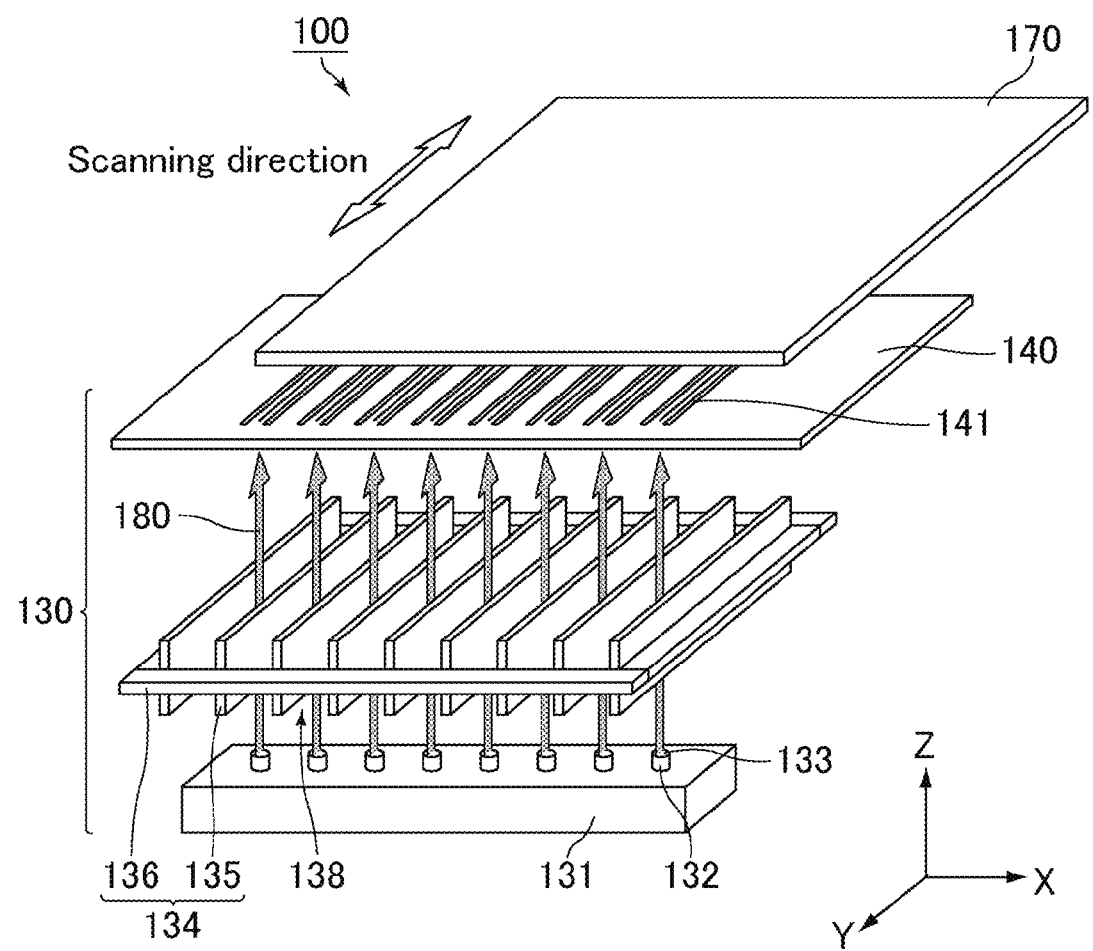
FIG. 5 is a schematic perspective view of a vapor deposition device of Embodiment 1.
Figure 6:
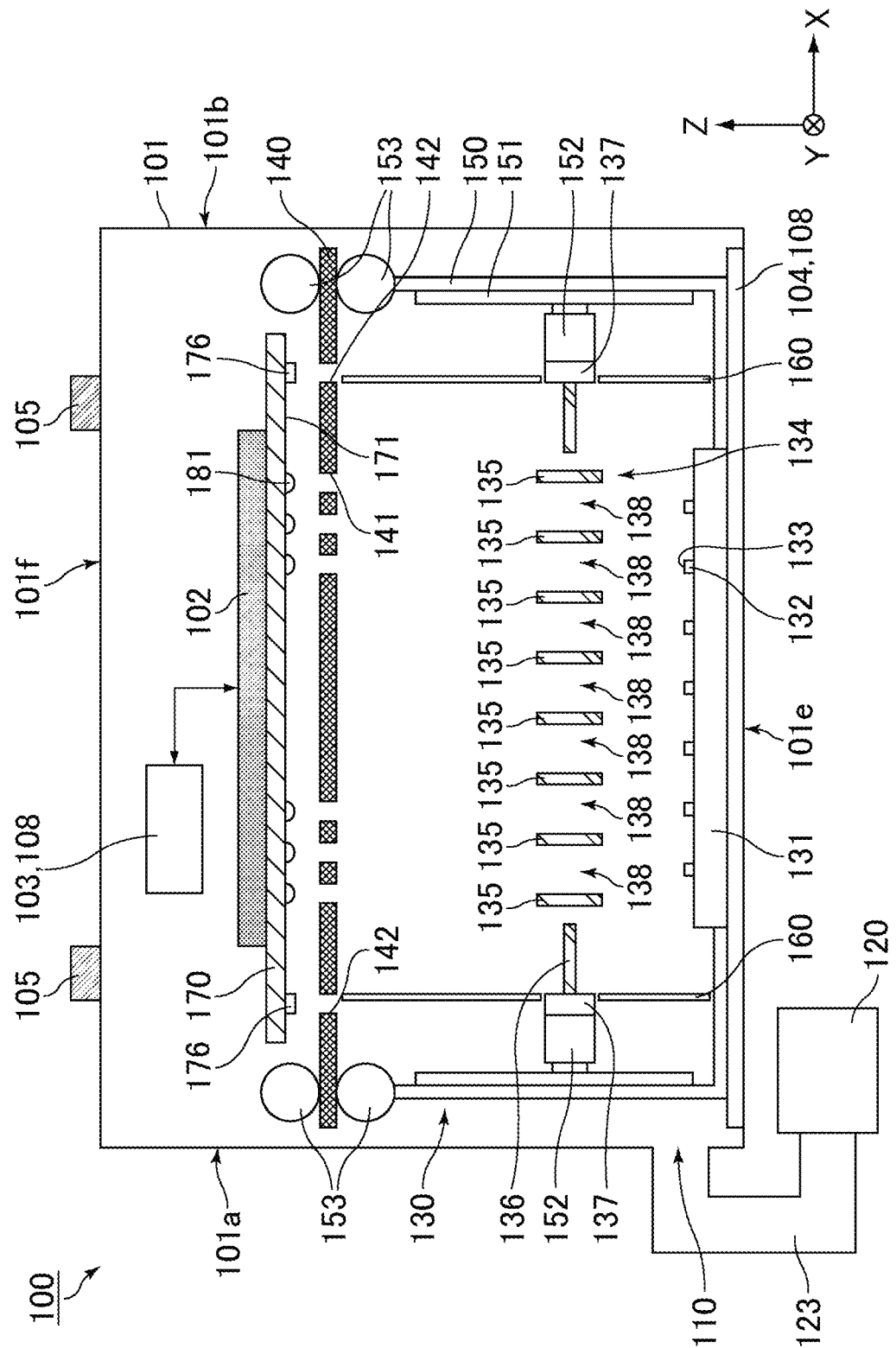
FIG. 6 is a schematic cross-sectional view of the vapor deposition device of Embodiment 1 illustrating a cross section perpendicular to the direction of scanning the substrate.
Figure 7:
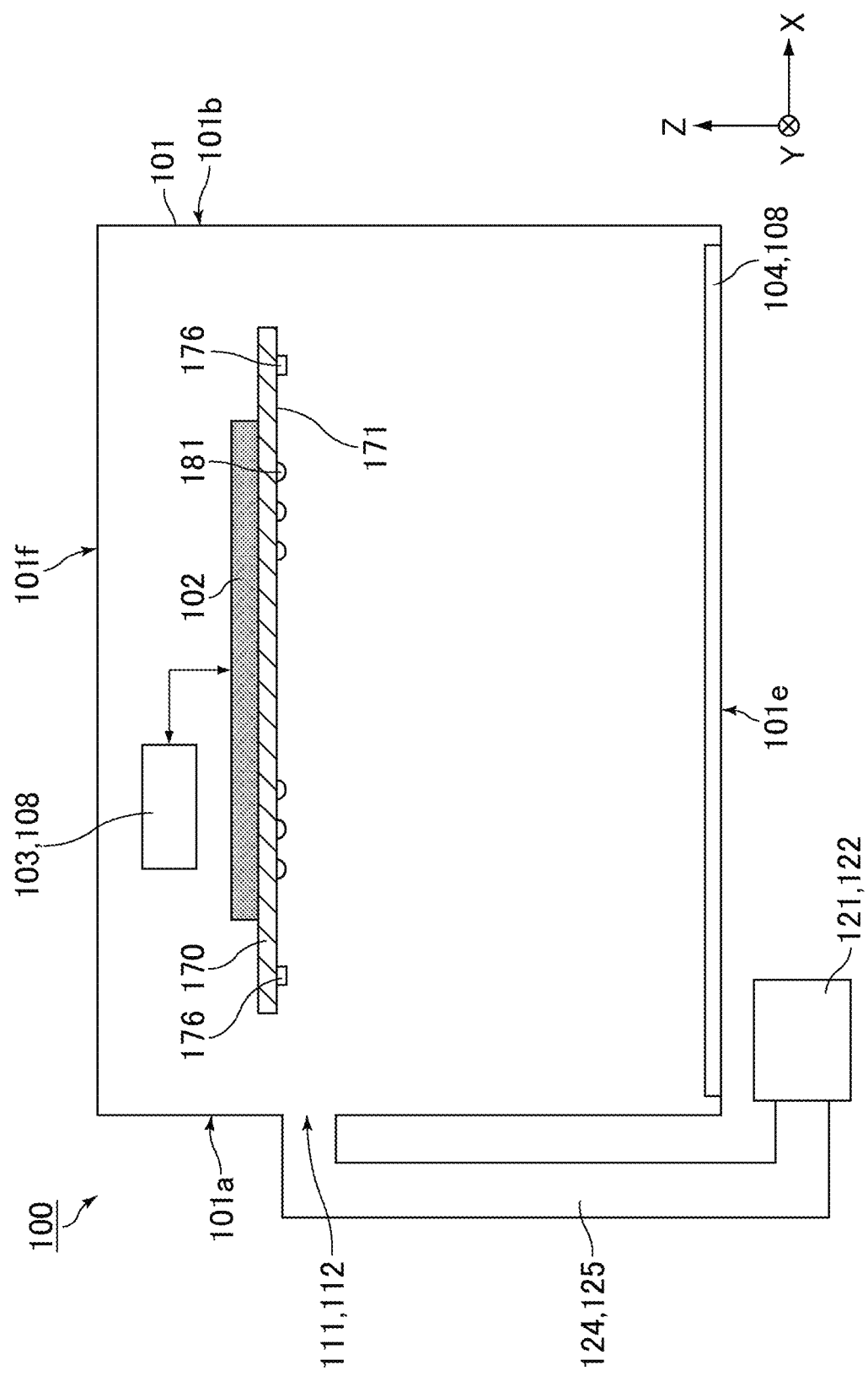
FIG. 7 is a schematic cross-sectional view of the vapor deposition device of Embodiment 1 illustrating a cross section perpendicular to the direction of scanning the substrate.
Figure 8:
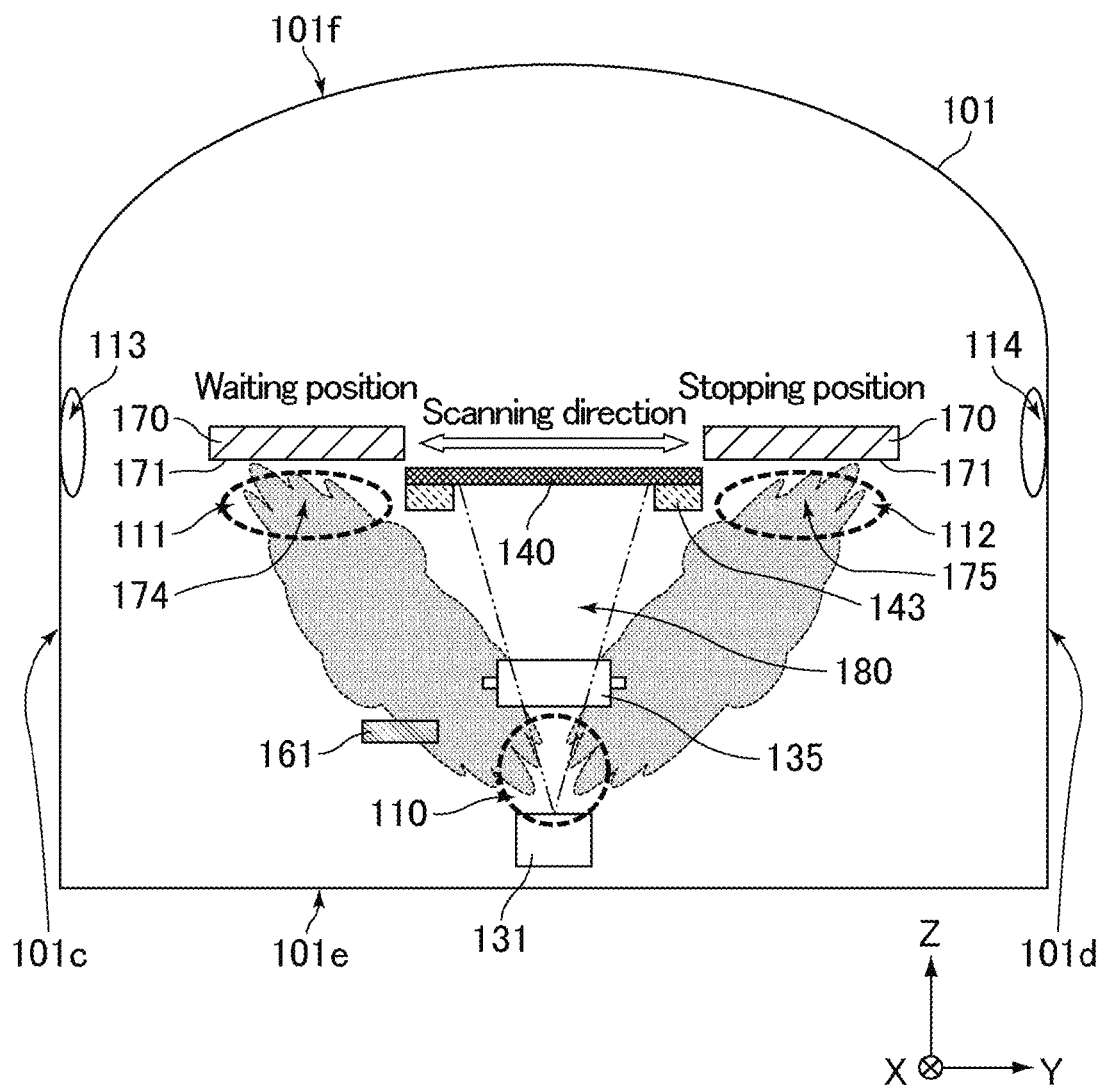
FIG. 8 is a schematic cross-sectional view of the vapor deposition device of Embodiment 1 illustrating a cross section perpendicular to the X-axis direction.

FIG. 5 is a schematic perspective view of a vapor deposition device of Embodiment 1. FIGS. 6 and 7 are each a schematic cross-sectional view of the vapor deposition device of Embodiment 1 illustrating a cross section perpendicular to the direction of scanning the substrate. FIG. 6 illustrates a cross section at the position where the vapor deposition mask and the vapor deposition source are disposed, and FIG. 7 illustrates a cross section at the waiting or resting position of the substrate. FIG. 8 is a schematic cross-sectional view of the vapor deposition device of Embodiment 1 illustrating a cross section perpendicular to the X-axis direction.

As illustrated in FIGS. 5 to 8, a vapor deposition device 100 according to the present embodiment includes a vapor deposition chamber (film-forming chamber) 101, a substrate holder 102, a substrate transporting device 103 and a vapor deposition unit transporting device 104 serving as transport mechanisms 108, an alignment monitoring device such as an image sensor 105, a vapor deposition unit 130, a shutter 161, and a control circuit (not illustrated) for controlling the driving of the vapor deposition device 100. The substrate holder 102, the transport mechanisms 108 (the substrate transporting device 103 and the vapor deposition unit transporting device 104), the vapor deposition unit 130, and the shutter 161 are disposed inside the vapor deposition chamber 101.

The vapor deposition chamber 101 includes a pair of walls 101a and 101b opposite to each other and a pair of walls 101c and 101d opposite to each other. The walls 101a and 101b are adjacent to the vapor deposition unit 130 in the X-axis direction, and are arranged along the YZ plane. The walls 101c and 101d are adjacent to the vapor deposition unit 130 in the Y-axis direction, and are arranged along the XZ plane.

The wall 101a is provided with a first vent 110 for discharging the air in the whole vapor deposition chamber 101, and the wall 101a is specially provided with second vents 111 and 112 for discharging a contaminant. The first vent 110 is coupled with a vacuum pump 120 via a pipe 123, and the second vents 111 and 112 are respectively coupled with vacuum pumps 121 and 122 via pipes 124 and 125. These vents 110, 111, and 112 enable discharge of the air inside the vapor deposition chamber 101. During vapor deposition, the inside of the vapor deposition chamber 101 is decompressed and under low pressure. The wall 101b opposite to the wall 101a may also be provided with vents opposite to the vents 110, 111, and 112. This improves the air-discharging ability.

The vapor deposition unit 130 includes a vapor deposition mask 140, a mask frame 143, a limiting member 134, a vapor deposition source 131, a holder 150, a sliding device 151, a supporting member 152, and a tension mechanism 153.

The holder 150 is a member for integrating the vapor deposition mask 140, the limiting member 134, and nozzles 132 (together with the vapor deposition source 131). The purpose of such integration is to fix multiple openings 141 of the vapor deposition mask 140, multiple limiting spaces 138 in the limiting member 134, and the nozzles 132 at the corresponding positions. As will be mentioned later, when the vapor deposition mask 140 is slid with the sliding device 151, the limiting member 134 and the nozzles 132 also need to be slid. The integration of the above three members by the holder 150 enables sliding of the three members with the positions thereof being fixed.

The supporting member 152 is a member for linking the limiting member 134 to the holder 150.

Figure 9:
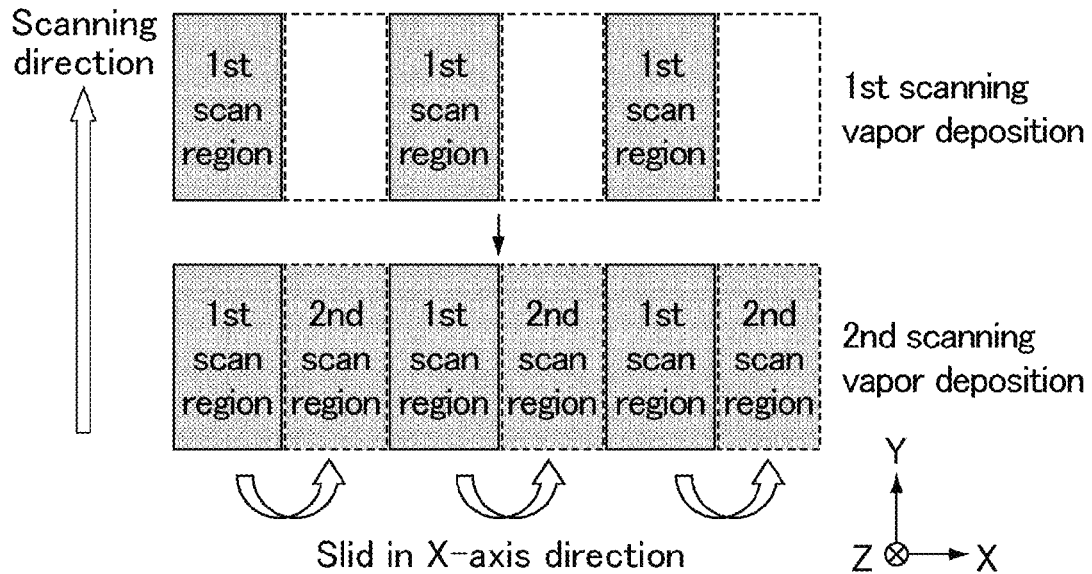
FIG. 9 is a schematic diagram of one embodiment of scanning vapor deposition in Embodiment 1.

FIG. 9 is a schematic diagram of one embodiment of scanning vapor deposition in Embodiment 1.

The sliding device 151 is a device for sliding the integration of the three members. The purpose of such sliding is as follows. If a blue light-emitting material is not vapor-deposited on the entire surface of the substrate 170 by a single scanning vapor-depositing operation, the whole vapor deposition unit 130 is slid in the X-axis direction and another scanning vapor-depositing operation is performed. Thereby, the blue light-emitting material is vapor-deposited on regions (regions defined by dotted lines in FIG. 9) where the material is not vapor-deposited in the first scanning vapor-depositing operation, as illustrated in FIG. 9.

The substrate holder 102 is a member for holding the substrate (film-forming-target substrate) 170 to be covered with a vapor-deposited (formed) film using the vapor deposition device 100. The substrate holder 102 holds the substrate 170 such that the vapor-deposition-target surface 171 thereof is opposite to the vapor deposition mask 140.

The substrate 170 is a substrate produced through the step S1 of producing a TFT substrate and first electrodes and the step S2 of vapor-depositing a hole-injection layer and a hole-transport layer. As mentioned above, the substrate includes the TFTs 12, the conductive lines 14, the interlayer film 13, the first electrodes 21, the edge cover 15, and the hole-injection/hole-transport layer 22 disposed on the insulating substrate 11.

Figure 10:
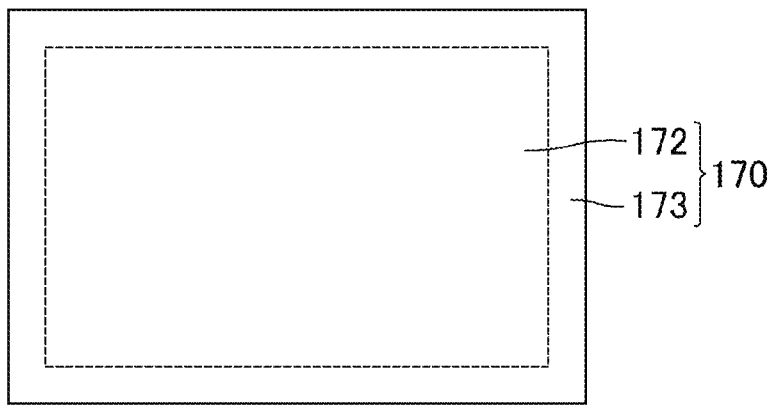
FIG. 10 is a schematic plan view of a substrate to be covered with a vapor-deposited film using the vapor deposition device of Embodiment 1.

FIG. 10 is a schematic plan view of a substrate to be covered with a vapor-deposited film using the vapor deposition device of Embodiment 1.

As illustrated in FIG. 10, the substrate 170 includes a vapor-deposition-target region 172 to be covered with a vapor-deposited film using the vapor deposition device 100 and a non-vapor-deposition region 173 that is not to be covered with a vapor-deposited film and that is disposed around the vapor-deposition-target region 172.

The substrate holder 102 is preferably an electrostatic chuck. Thereby, the substrate 170 is held by the substrate holder 102 with no bending due to its own weight.

In the vapor deposition device 100, one of the substrate 170 and the vapor deposition unit 130 is transferred (scanned) relative to the other by the transport mechanism 108 in the Y-axis direction, and the vapor deposition is performed while these components are scanned (scanning vapor deposition). In other words, the Y-axis direction corresponds to the scanning direction.

The substrate transporting device 103 includes a motor and a motor drive controller (both not illustrated), for example, and the substrate 170 held by the substrate holder 102 is transferred by driving the motor with the motor drive controller.

Also, the vapor deposition unit transporting device 104 includes a motor and a motor drive controller (both not illustrated), for example, and the vapor deposition unit 130 is transferred relative to the substrate 170 by driving the motor by the motor drive controller.

The transport mechanisms 108 each perform alignment (position adjustment) of the vapor deposition mask 140 and the substrate 170. Specifically, for example, the substrate transporting device 103 and the vapor deposition unit transporting device 104 respectively transfer the substrate 170 and the vapor deposition mask 140 such that an alignment marker 142 disposed in a non-opening region of the vapor deposition mask 140 is aligned to an alignment marker 176 disposed in a non-vapor-deposition region 173 of the substrate 170 based on an image obtained by an alignment monitoring device. Thereby, misalignment of the vapor deposition mask 140 relative to the substrate 170 is eliminated.

The vapor deposition device 100 may include an elevating mechanism (not illustrated), and the alignment of the vapor deposition mask 140 and the substrate 170 may be achieved by the transport mechanisms 108 and the elevating mechanism.

The substrate transporting device 103 and the vapor deposition unit transporting device 104 each may be a roller-type transporting device or a hydraulic transporting device. The substrate transporting device 103 and the vapor deposition unit transporting device 104 each may include, for example, a driving unit composed of a motor (an XYθ driving motor) (e.g., a stepper motor (pulse motor)), a roller, a gear, and others, and a drive control unit such as a motor drive controller, and may transfer the substrate 170 or the vapor deposition unit 130 by driving the driving unit with the drive control unit. Further, the substrate transporting device 103 and the vapor deposition unit transporting device 104 each may include a driving unit composed of an XYZ stage, for example, and may be a device capable of transferring the substrate 170 or the vapor deposition unit 130 in any of the X-axis direction, the Y-axis direction, and the Z-axis direction.

Both of the substrate 170 and the vapor deposition unit 130 are not necessarily to be transferred, and at least one of them has only to be transferred relative to the other of them. In other words, the vapor deposition device 100 has only to include at least one of the substrate transporting device 103 and the vapor deposition unit transporting device 104 as the transport mechanism 108, and may include only one of the substrate transporting device 103 and the vapor deposition unit transporting device 104.

In the case where the substrate 170 is disposed in a transferable manner, the vapor deposition unit 130 may be fixed on a floor 101e of the vapor deposition chamber 101. In the case where the vapor deposition unit 130 is disposed in a transferable manner, the substrate holder 102 may be fixed on a ceiling 101f of the vapor deposition chamber 101.

The wall 101c of the vapor deposition chamber 101 is provided with a substrate inlet 113 through which the substrate 170 is carried into the vapor deposition chamber 101, and the wall 101d of the vapor deposition chamber 101 is provided with a substrate outlet 114 through which the substrate 170 is carried out of the vapor deposition chamber 101.

Instead of providing the substrate inlet 113 and the substrate outlet 114, a single carry-in/carry-out port through which the substrate 170 is carried into the vapor deposition chamber 101 and through which the substrate 170 is carried out of the vapor deposition chamber 101 may be disposed on the wall 101c or the wall 101d.

The vapor deposition source 131 is a container configured to contain a vapor-deposition material therein, and is provided with a heater (not illustrated) for heating the vapor-deposition material. A plurality of the nozzles 132 is disposed at regular intervals on a portion opposite to the limiting member 134, i.e., the upper portion of the vapor deposition source 131. The tip of each nozzle has an injection port 133 that is an opening. The injection ports 133 are disposed on the same straight line parallel to the X-axis direction. The vapor-deposition material is heated by the heater to become steam, and this steam spreads in the vapor deposition source 131 and spouts upward from the injection ports 133. As a result, the injection ports 133 generate vapor deposition streams 180 that are streams of the vapor deposition particles. The vapor deposition streams 180 immediately after spouting from the injection ports 133 spread isotropically.

The limiting member 134 is a member configured to eliminate unnecessary components (vapor deposition particles) from the vapor deposition streams 180 spouted from the injection port 133, and includes multiple plate-like limiting plates 135, a holding member 136 that holds the limiting plates 135, and a supporting member 137 that is connected to the holding member 136.

The multiple limiting plates 135 are disposed at regular intervals, and the injection ports 133 are disposed one by one below the respective spaces (hereinafter, also referred to as limiting spaces) between adjacent limiting plates 135. The vapor deposition streams 180 rise from the injection ports 133 to the respective limiting spaces 138. Part of the vapor deposition particles contained in the vapor deposition streams 180 can pass through the limiting spaces 138 to reach the vapor deposition mask 140. The rest of the vapor deposition particles adhere to the limiting plates 135 and fail to pass through the limiting spaces 138, and thus fail to reach the vapor deposition mask 140. Thereby, the vapor deposition streams 180 that isotropically spread immediately after spouting from the injection ports 133 are controlled by the limiting plates 135, and highly directed components are generated by blocking poorly directed components. Further, the limiting member 134 suppresses passing of the respective vapor deposition streams 180 through the limiting spaces 138 other than the limiting space 138 that is right above the stream.

Since the vapor deposition mask 140 is provided with the openings 141 for pattern formation, part of the vapor deposition particles reaching the vapor deposition mask 140 can pass through the openings 141. Thereby, the vapor deposition particles are deposited on the substrate 170 in a pattern corresponding to the openings 141.

As mentioned above, disposing the limiting member 134 can suppress an excessive increase in incident angles of the vapor deposition streams 180 to the substrate 170 in a view in the Y-axis direction, and can improve the directivity of the vapor deposition particles incident on the substrate 170 in the X-axis direction.

The shutter 161 is disposed in an insertable manner between the vapor deposition source 131 and the limiting plates 135. When the shutter 161 is inserted therebetween, the vapor deposition streams 180 are blocked. As mentioned here, appropriate insertion of the shutter 161 between the vapor deposition source 131 and the limiting plates 135 enables prevention of vapor deposition on an unnecessary portion of the substrate 170, i.e., the non-vapor-deposition region 173 of the substrate 170.

The openings 141 of the vapor deposition mask 140 each have a shape that is longer in the Y-axis direction and shorter in the X-axis direction (for example, a rectangular (slit-like) shape), and are arranged substantially parallel to the Y-axis direction. Part of the vapor deposition streams 180 flying to the vapor deposition mask 140 passes through the openings 141 to reach the substrate 170, and the rest thereof are blocked by the vapor deposition mask 140. Thereby, the vapor deposition particles deposit on the substrate 170 in a pattern corresponding to the openings 141.

The vapor deposition mask 140 is smaller than the substrate 170, and at least one side of the vapor deposition mask 140 is shorter than the corresponding side of the vapor-deposition-target region 172 of the substrate 170. This enables easy production of the vapor deposition mask 140 and suppresses bending of the vapor deposition mask 140 due to its own weight. Further, the vapor deposition mask 140 is welded with the mask frame 143 that is a frame-like reinforcing member and is held while a tension is applied thereto by the tension mechanism 153. This further suppresses bending of the vapor deposition mask 140.

The vapor deposition mask 140 may be formed from any material, such as metal. The vapor deposition mask 140 may have any thickness such as about several tens of micrometers.

In order to prevent damages on the substrate 170 during scanning, the substrate 170 moves above the vapor deposition mask 140 at a certain distance therefrom during vapor deposition. This distance may be any appropriately set value. For example, this distance may be similar to the distance between the vapor deposition mask and the substrate used in conventional scanning vapor deposition.

The distance between the vapor deposition mask 140 and the surface with the injection ports 133 disposed thereon is also maintained at a certain distance during vapor deposition. This distance may be any appropriately set value. For example, this distance may be similar to the distance between the vapor deposition mask and the surface with the injection ports disposed thereon used in conventional scanning vapor deposition.

The vapor deposition source 131, the limiting member 134, and the vapor deposition mask 140 are integrated into the vapor deposition unit 130. Thus, these members are fixed with each other and the relative positions are substantially constant during vapor deposition.

The following will describe the motion of the vapor deposition device 100 in the step S3 of vapor-depositing a light-emitting layer.

Figure 11:
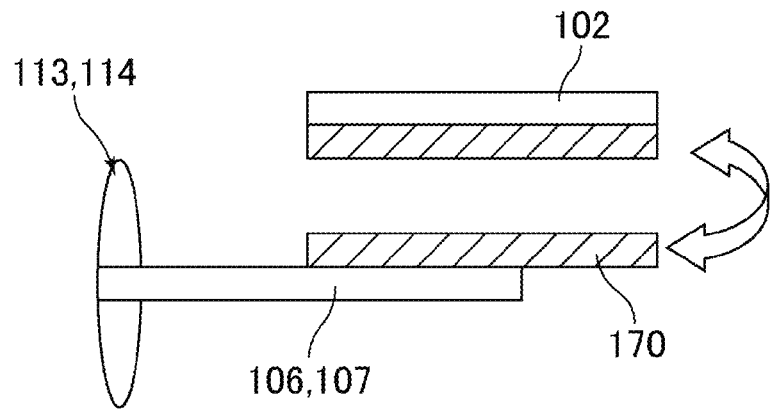
FIG. 11 is a schematic view of a structure around a substrate inlet or a substrate outlet of the vapor deposition device of Embodiment 1.

FIG. 11 is a schematic view of a structure around a substrate inlet or a substrate outlet of the vapor deposition device of Embodiment 1.

First, as illustrated in FIG. 11, the substrate 170 held by an arm 106 disposed outside the vapor deposition chamber 101 is carried into the vapor deposition chamber 101 through the substrate inlet 113. The substrate 170 is delivered by the arm 106 to the substrate holder 102, and is held by the substrate holder 102.

Figure 12:
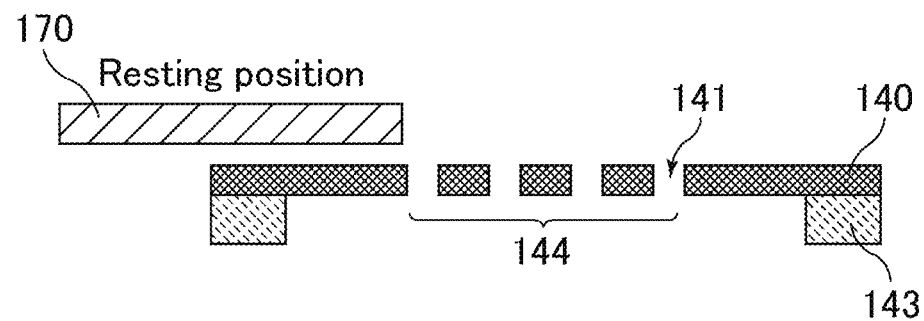
FIG. 12 is a schematic cross-sectional view of the vapor deposition device of Embodiment 1 illustrating a cross section perpendicular to the X-axis direction.

FIG. 12 is a schematic cross-sectional view of the vapor deposition device of Embodiment 1 illustrating a cross section perpendicular to the X-axis direction.

Next, the substrate 170 held by the substrate holder 102 is transported by the transport mechanism 108 to a resting position (hereinafter, also referred to as a waiting position) in the vapor deposition chamber 101, and is put on standby. In other words, the substrate 170 is temporarily made to rest at the waiting position relative to the vapor deposition unit 130. The waiting position is close to the vapor deposition mask 140. As illustrated in FIG. 12, when the substrate 170 is at the resting position (waiting position), the vapor-deposition-target region 172 of the substrate 170 overlaps none of the openings 141 of the vapor deposition mask 140. The peripheral portion of the vapor deposition mask 140 is welded to the mask frame 143, and has no opening for pattern formation. Thus, when the substrate 170 is at the waiting position, the vapor-deposition-target region 172 of the substrate 170 may overlap the peripheral portion of the vapor deposition mask 140. When the substrate 170 is at the waiting position, the vapor-deposition-target region 172 of the substrate 170 may overlap a region excluding the opening region 144 provided with the openings 141, i.e., the non-opening region.

When the substrate 170 is at the waiting position, alignment (substrate alignment) is performed so as to align the transport axis and the axis of the substrate 170. Next, alignment (mask alignment) is performed between the substrate 170 and the vapor deposition mask 140. Therefore, the substrate 170 always remains at the waiting position during these alignment operations. Further, the substrate 170 is put on standby at the waiting position until the vapor-deposition rate is stabilized. These alignment operations are performed by the transport mechanisms 108 (and the elevating mechanism) based on an image obtained by the alignment monitoring device.

Then, at least one of the substrate 170 and the vapor deposition unit 130 is transferred relative to the other by the transport mechanism 108 in the Y-axis direction at a certain relative velocity such that the substrate 170 and the vapor deposition mask 140 pass by each other. For example, the substrate 170 is scanned above the vapor deposition mask 140 in the positive Y-axis direction at a certain velocity. Then, the shutter 161 is retreated from between the vapor deposition source 131 and the limiting plates 135 at a desired timing, and the vapor deposition particles are attached to the vapor-deposition-target region 172 of the substrate 170, so that a stripe-like film (vapor-deposited film) is formed. After the vapor-deposition-target region 172 of the substrate 170 is passed above the vapor deposition mask 140, the shutter 161 is again inserted between the vapor deposition source 131 and the limiting plate 135. Thereby, the first vapor-depositing operation on the substrate 170 is finished.

The substrate 170 passed above the vapor deposition mask 140 is again temporarily stopped at a resting position (hereinafter, also referred to as a stopping position) that is different from the waiting position in the vapor deposition chamber 101. In other words, the substrate 170 is temporarily made to rest at the stopping position relative to the vapor deposition unit 130. The stopping position is close to the vapor deposition mask 140. As illustrated in FIG. 12, when the substrate 170 is at the resting position (stopping position), the vapor-deposition-target region 172 of the substrate 170 overlaps none of the openings 141 of the vapor deposition mask 140. Similar to the case of the waiting position, when the substrate 170 is at the stopping position, the vapor-deposition-target region 172 of the substrate 170 may overlap the peripheral portion of the vapor deposition mask 140 or may overlap the non-opening region of the vapor deposition mask 140. The stopping position and the waiting position are at the opposite sides of the vapor deposition mask 140 while the vapor deposition mask 140 is between the positions. The stopping position corresponds to the starting position of the transfer (scanning) for vapor deposition, and the waiting position corresponds to the finishing position of the transfer (scanning) for vapor deposition.

Then, at least one of the substrate 170 and the vapor deposition unit 130 is transferred relative to the other by the transport mechanism 108 in the Y-axis direction such that the substrate 170 and the vapor deposition mask 140 pass by each other. For example, the substrate 170 is scanned above the vapor deposition mask 140 in the negative Y-axis direction at a certain velocity. Then, in the same manner as in the first vapor-depositing operation, the vapor deposition particles are further deposited on the vapor-deposited film formed in the first vapor-depositing operation.

As mentioned above, the multiple vapor-depositing operations by reciprocating the substrate 170 above the vapor deposition mask 140 provide a stripe-like vapor-deposited film 181 with desired thickness as the light-emitting layer 23R, 23G, or 23B.

As illustrated in FIG. 9, the first scanning vapor-depositing operation and the second scanning vapor-depositing operation may form vapor-deposited films in different regions. In this case, either of the following modes (1) and (2) may be applied.

(1) The substrate 170 is stopped at the stopping position, and the vapor deposition unit 130 is slid in the X-axis direction. The mask alignment is performed in the same manner as when the substrate 170 is at the waiting position. Then, the second scanning vapor-depositing operation is performed.

(2) The substrate 170 is stopped at the stopping position. The shutter 161 is closed and the substrate 170 is returned to the waiting position. At this timing, the vapor deposition unit 130 is slid in the X-axis direction. Then, the mask alignment is performed in the same manner as mentioned above. Thereafter, the second scanning vapor-depositing operation is performed.

The modes (1) and (2) are mere examples, and any other modes may be applied, such as a mode in which the sliding of the vapor deposition unit 130 in the X-axis direction is performed when the substrate is at the stopping position and the mask alignment is performed when the substrate is at the waiting position.

In the step S3 of vapor-depositing a light-emitting layer, the aforementioned series of vapor-depositing operations is performed three times using three light-emitting materials. Thereby, the light-emitting layers 23R, 23G, and 23B of three colors are successively formed. The light-emitting layers 23R, 23G, and 23B may be formed in any appropriately set order.

After the vapor deposition of all the light-emitting layers is finished, the substrate 170 is transported by the transport mechanism 108 to the vicinity of the substrate outlet 114. Then, an arm 107 disposed outside the vapor deposition chamber 101 moves into the vapor deposition chamber 101 through the substrate outlet 114, and receives the substrate 170 from the substrate holder 102. Thereafter, the substrate 170 held by the arm 107 is carried out of the vapor deposition chamber 101 by the arm 107.

As a result, the step S3 of vapor-depositing a light-emitting layer is completed.

As mentioned above, the vapor deposition particles isotropically emitted from the vapor deposition source 131 are controlled into highly directed distribution by the limiting plates 135. However, some vapor deposition particles may not go toward the limiting plates 135 from the vapor deposition source 131 but go around the limiting plates toward the waiting position or the stopping position of the substrate 170. Further, the vapor deposition particles controlled by the limiting plates 135, i.e., the vapor deposition particles passed through the limiting spaces 138, may again spread due to scattering of the particles, for example, to reach the waiting position or the stopping position of the substrate 170.

At the waiting position or the stopping position, the vapor-deposition-target region 172 of the substrate 170 does not overlap the vapor deposition mask 140. Thus, the vapor deposition particles flying toward the waiting position or the stopping position may adhere to an undesired region as a contaminant. In particular, the substrate 170 at the waiting position and the stopping position, which is temporarily made to rest, is seriously affected by the contaminant.

Thus, in the present embodiment, the second vents 111 and 112 are provided in addition to the first vent 110. As illustrated in FIG. 8, when the substrate 170 is at the waiting position, at least part of the second vent 111 is below the substrate 170 in a view in the X-axis direction, and when the substrate 170 is at the stopping position, at least part of the second vent 112 is below the substrate 170 in a view in the X-axis direction. In other words, at least part of the second vent 111 is below the substrate 170 at the waiting position and at least part of the second vent 112 is below the substrate 170 at the stopping position in a view in the X-axis direction. Thereby, the contaminant scattered from the vapor deposition source 131 can be discharged through the second vents 111 and 112 before adhering to the substrate 170, and thus adhesion of the contaminant to the substrate 170 at the waiting position or the stopping position can be suppressed. This results in suppression of a decrease in luminance of an organic EL display device produced using the vapor deposition device 100.

The contaminant may possibly adhere to the substrate 170 when the substrate 170 is transported. Still, the time of transporting the substrate 170 is very short and the time of being exposed to the contaminant is slight in comparison with the residence times at the waiting position and the stopping position. Thus, in order to effectively suppress a decrease in luminance due to the contaminant, the second vents 111 and 112 need to be disposed below the substrate 170 at the waiting position and the stopping position, as mentioned above.

In the case of the film-forming device of Patent Literature 2, only a single vent performs discharge of the air in the whole treatment container. Thus, the air of a region around the second film-forming mechanism that is farther from the vent is less likely to be discharged. As a result, disadvantageously, discharge of the air in the whole treatment container takes a long time and the resulting degree of evacuation is poor.

In contrast, in the present embodiment, the second vents 111 and 112 are disposed in addition to the first vent 110 that discharges the air in the whole vapor deposition chamber 101. This can prevent lengthening of the discharge of the air in the whole vapor deposition chamber 101 and can prevent a poor degree of evacuation.

Instead of the second vents 111 and 112, an anti-adhesion plate may be considered to be disposed below the substrate 170 at the waiting position or the stopping position. However, such an anti-adhesion plate cannot completely divide the upper space and the lower space thereof and an unavoidable space is formed between the anti-adhesion plate and the other components. As a result, the contaminant blows off of the space and may adhere to the substrate 170.

Further, in the present embodiment, the substrate 170 is always exposed to the contaminant at positions where the substrate does not overlap the vapor deposition mask 140, such as the waiting position or the stopping position. Thus, if the whole vapor deposition chamber 101 is washed with plasma or gas, the region to be essentially covered with a vapor-deposited film is also cleaned. It is difficult to locally clean the chamber with plasma or gas.

Therefore, the present embodiment providing the second vents 111 and 112 can provide the most effective technique of removing the contaminant.

The following will more specifically describe the positional relationship between the second vent 111 and the substrate 170 at the waiting position and the positional relationship between the second vent 112 and the substrate 170 at the stopping position. Specifically, assuming that the substrate 170 at the waiting position is moved downward in the vertical direction by a certain distance, the moved substrate 170 partially or completely overlaps the second vent 111 in a view in the X-axis direction. Assuming that the substrate 170 at the stopping position is moved downward in the vertical direction by a certain distance, the moved substrate 170 partially or completely overlaps the second vent 112 in a view in the X-axis direction.

As mentioned above, in the present description, when one thing (lower thing) is positioned below another thing (upper thing) and assuming that the upper thing is moved downward in the vertical direction by a certain distance, the moved upper thing may partially or completely overlap the lower thing. In contrast, when one thing (upper thing) is above another thing (lower thing) and assuming that the lower thing is moved upward in the vertical direction by a certain distance, the moved lower thing may partially or completely overlap the upper thing. Of course, this upper and lower positional relationship can be applied not only to a combination of substances such as a substrate, but also a combination of spaces (e.g., vents, gaps) or a combination of a substance and a space.

The first vent 110 may be disposed at any appropriately set position. Still, the first vent 110 is preferably disposed near the vapor deposition source 131, and at least part of the first vent 110 is preferably above the vapor deposition source 131 in a view in the X-axis direction. This is because as follows. Specifically, in the case of disposing a plurality of the vapor deposition sources 131 and performing the vapor-depositing treatment while the vapor deposition source at work is switched from one to another, the air near the vapor deposition sources where the vapor deposition particles are at the highest density is preferentially discharged, and thereby the density of the vapor deposition particles can be decreased in a short time. If the vapor deposition source at work is switched from one to another while the vapor deposition particles are at a high density, the vapor deposition particles before the switching may flow into and contaminate the vapor deposition source after the switching. Thus, in the case of a process and a device mechanism with no possibility of contamination, such as a case without switching of multiple vapor deposition sources, the first vent 110 may not be disposed near the vapor deposition source 131.

In the case of switching the multiple vapor deposition sources, the following embodiments are preferred.

Figure 13:
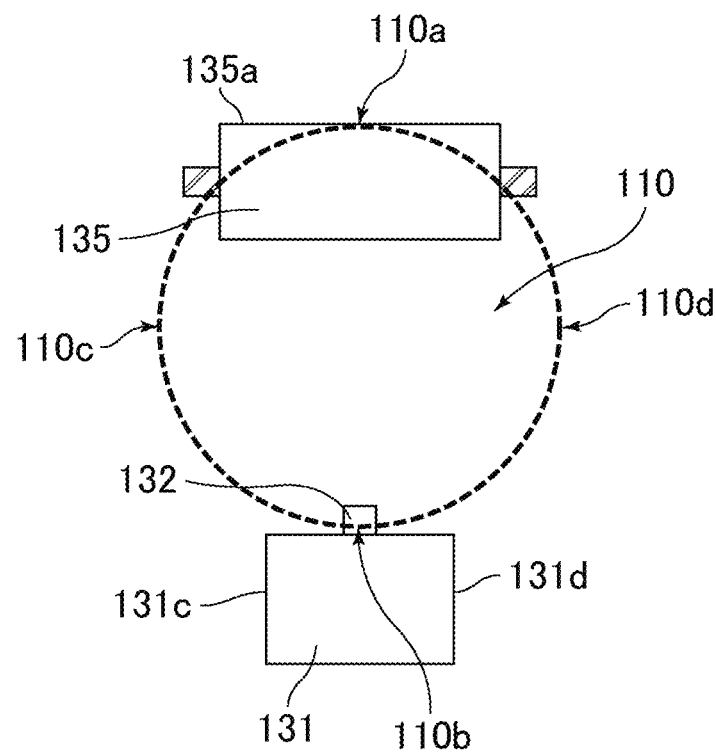
FIG. 13 is a schematic cross-sectional view of the vapor deposition device of Embodiment 1 illustrating a cross section perpendicular to the X-axis direction.
Figure 14:
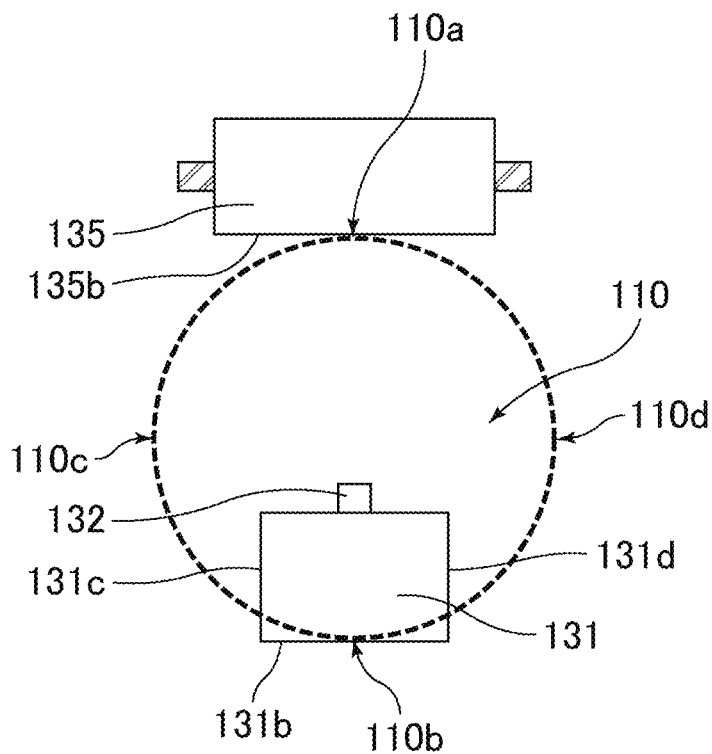
FIG. 14 is a schematic cross-sectional view of the vapor deposition device of Embodiment 1 illustrating a cross section perpendicular to the X-axis direction.

FIGS. 13 and 14 are each a schematic cross-sectional view of the vapor deposition device of Embodiment 1 illustrating a cross section perpendicular to the X-axis direction.

In the case of switching the multiple vapor deposition sources, the first vent 110 needs to discharge the vapor deposition particles near the vapor deposition sources 131. Thus, a lower end 110b of the first vent 110 is preferably at the same height as or lower than the nozzle 132 as illustrated in FIG. 13, more preferably at the same height as a lower end 131b of the vapor deposition source 131 as illustrated in FIG. 14. If the first vent 110 is higher than an upper end 135a of the limiting plate 135, even the effective vapor deposition particles controlled by the limiting plates 135 may possibly be discharged through the first vent 110. Thus, an upper end 110a of the first vent 110 is preferably at the same height as or lower than the upper end 135a of the limiting plate 135 as illustrated in FIG. 13, more preferably at the same height of a lower end 135b of the limiting plate 135 as illustrated in FIG. 14.

Examples of preferred embodiments in the case of switching the multiple vapor deposition sources further include the following.

Figure 15:
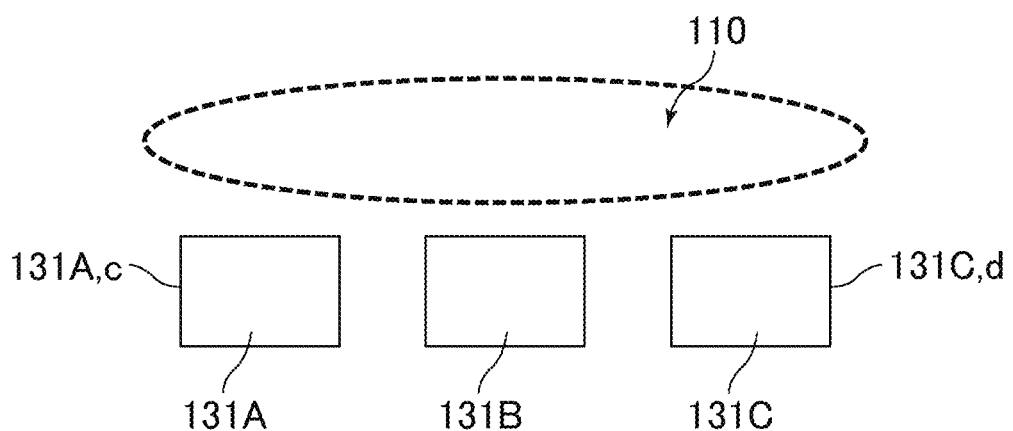
FIG. 15 is a schematic cross-sectional view of the vapor deposition device of Embodiment 1 illustrating a cross section perpendicular to the X-axis direction.
Figure 16:
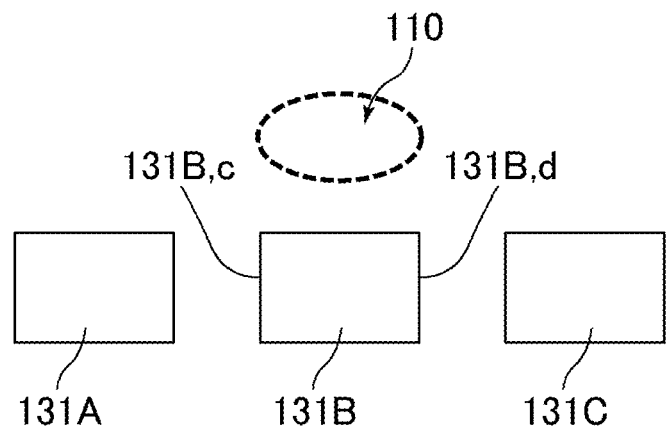
FIG. 16 is a schematic cross-sectional view of the vapor deposition device of Embodiment 1 illustrating a cross section perpendicular to the X-axis direction.

FIGS. 15 and 16 are each a schematic cross-sectional view of the vapor deposition device of Embodiment 1 illustrating a cross section perpendicular to the X-axis direction.

In the case of disposing multiple vapor deposition sources 131A, 131B, and 131C as illustrated in FIG. 15, the width of the first vent 110 is preferably the same as or greater than the distance between a left end 131A,c of the leftmost vapor deposition source 131A and a right end 131C,d of the rightmost vapor deposition source 131C in a view in the X-axis direction. If such a first vent 110 with an increased size causes a significantly poor air-discharging ability, the following embodiment is preferred. Specifically, the vapor deposition particles emitted from the vapor deposition sources 131A, 131B, and 131C may have different densities. As illustrated in FIG. 16, the width of the first vent 110 may be the same as or greater than the distance between the left and right ends of the vapor deposition source giving the highest density of the vapor deposition particles among the vapor deposition sources 131A, 131B, and 131C (e.g., the distance between a left end 131B,c and a right end 131B,d of the vapor deposition source 131B) in a view in the X-axis direction. This secures the air-discharging ability and enables efficient removal of the contaminant simultaneously. This embodiment is suitable for the case of co-vapor-depositing a host and a dopant. This is because the density of the host vapor deposition particles is higher than the density of the dopant vapor deposition particles. For example, the densities of the vapor deposition particles emitted from the vapor deposition sources 131A, 131B, and 131C may be respectively a middle density, a high density, and a low density.

Preferably, the second vents 111 and 112 are respectively disposed just below the waiting position and the stopping position of the substrate 170 in a view in the X-axis direction. This is because, as the second vents are apart farther from the substrate 170, the possibility becomes stronger that the remaining vapor deposition particles not discharged through the second vents 111 and 112 reach the substrate 170 at the waiting position or the stopping position.

From the same point of view, when the substrate 170 is at the waiting position or the stopping position, the second vents 111 and 112 respectively preferably face spaces 174 and 175 adjacent to the vapor-deposition-target surface 171 of the substrate 170.

It is preferred to dispose both the second vents 111 and 112. Still, if the mechanism of the vapor deposition device 100 prevents the vapor deposition particles from flying toward the waiting position or the stopping position, only one second vent may be disposed. The following gives specific examples of such a case.

Figure 17:
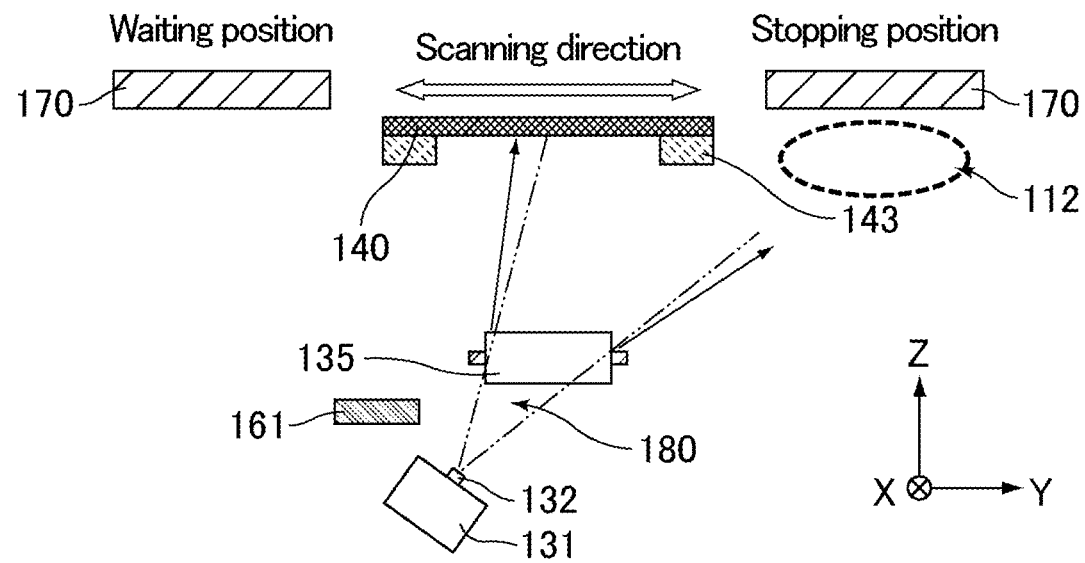
FIG. 17 is a schematic cross-sectional view of the vapor deposition device of Embodiment 1 illustrating a cross section perpendicular to the X-axis direction.
Figure 18:
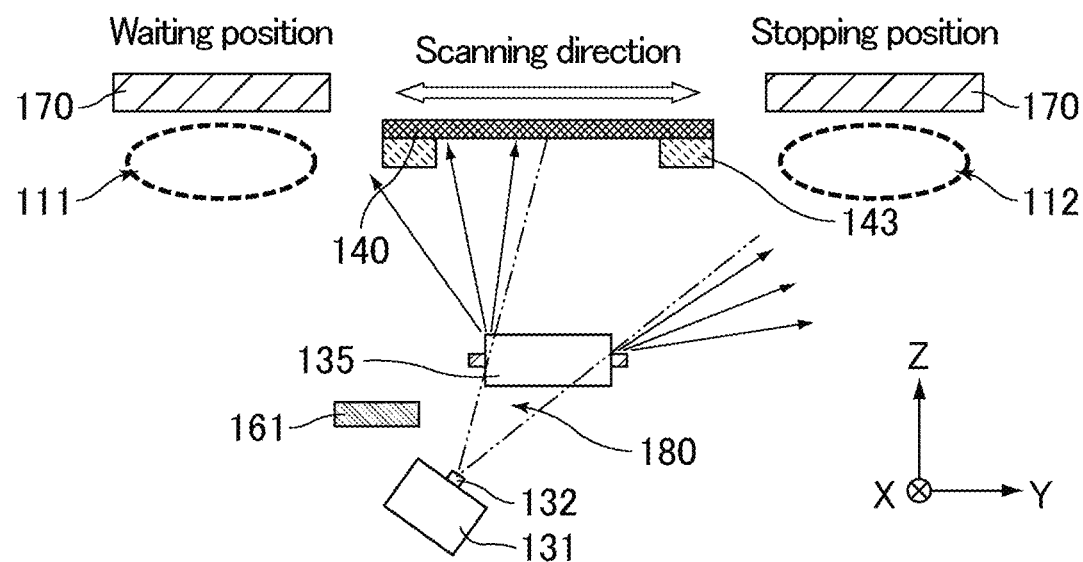
FIG. 18 is a schematic cross-sectional view of the vapor deposition device of Embodiment 1 illustrating a cross section perpendicular to the X-axis direction.

FIGS. 17 and 18 are each a schematic cross-sectional view of the vapor deposition device of Embodiment 1 illustrating a cross section perpendicular to the X-axis direction.

As illustrated in FIG. 17, the direction of the nozzles 132 may be tilted to the normal direction of the substrate 170, in other words, the direction of the nozzles 132 may not be parallel to the Z-axis direction. Tilting the direction of the nozzles 132 gives anisotropy to the vapor-deposited film 181. Further, in the case of co-vapor-depositing a host and a dopant, the co-vapor-deposited film can have a gradient distribution of the dopant concentration.

When the nozzle 132 is tilted toward the substrate 170 at the stopping position as illustrated in FIG. 17, the vapor deposition particles are more likely to fly toward the stopping position at a low vapor-deposition rate. Thus, in this case, only the second vent 112 may be provided and the second vent 111 may not be provided.

However, as illustrated in FIG. 18, a high vapor-deposition rate may cause the vapor deposition particles to more frequently collide with each other or scatter, so that the vapor deposition streams 180 passed through the limiting member 134 may significantly spread. In such a case, the vapor deposition particles may disadvantageously fly toward the waiting position, and thus the second vent 111 is also preferably provided.

The vacuum pumps 120, 121, and 122 respectively connected to the vents 110, 111, and 112 each may be of any type. Each of the vacuum pumps may be a usual vacuum pump, and is preferably a cryopump. This is because the cryopump has a high air-discharging ability.

The vents 110, 111, and 112 each may have any appropriately set shape. Specific examples of the shape include a circle, an oval, and a quadrangle.

Figure 19:
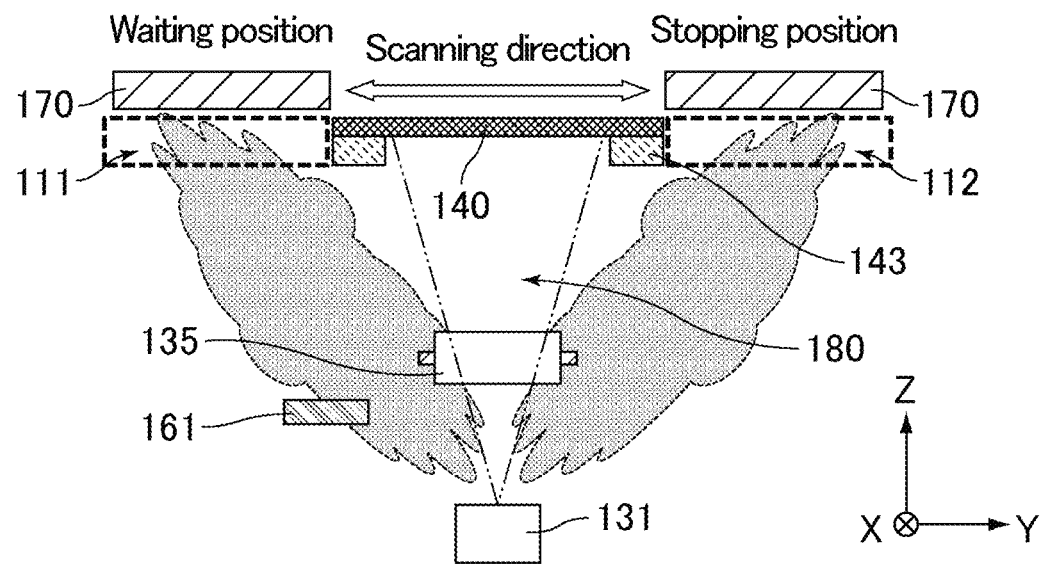
FIG. 19 is a schematic cross-sectional view of the vapor deposition device of Embodiment 1 illustrating a cross section perpendicular to the X-axis direction.
Figure 20:
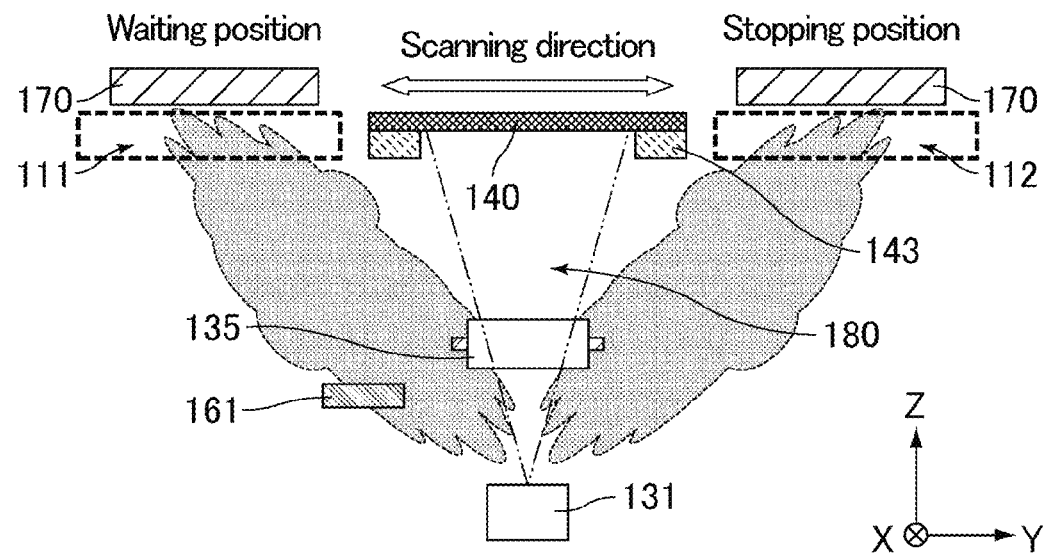
FIG. 20 is a schematic cross-sectional view of the vapor deposition device of Embodiment 1 illustrating a cross section perpendicular to the X-axis direction.

FIGS. 19 and 20 are each a schematic cross-sectional view of the vapor deposition device of Embodiment 1 illustrating a cross section perpendicular to the X-axis direction.

The second vents 111 and 112 may have any appropriately set size. As illustrated in FIG. 19, when the substrate 170 is at the waiting position or the stopping position, the widths (lengths in the Y-axis direction) of the second vents 111 and 112 are preferably not smaller than the width (length in the Y-axis direction) of the substrate 170 in the Y-axis direction in a view in the X-axis direction. If the widths of the second vents 111 and 112 are smaller than the width of the substrate 170, the vents may fail to discharge the contaminant when the contaminant reaches the entire region of the substrate 170.

In contrast, if the second vents 111 and 112 are very close to the vicinity of the ends of the vapor deposition mask 140 in a view in the X-axis direction, the second vents may disadvantageously discharge the vapor deposition particles that pass through the openings 141 of the vapor deposition mask 140 and are to be essentially deposited on the substrate 170. Thus, as illustrated in FIG. 20, the second vents 111 and 112 are preferably positioned apart from the vapor deposition mask 140 in a view in the X-axis direction. The distance between each of the second vents 111 and 112 and the vapor deposition mask 140 in a view in the X-axis direction may be appropriately set in accordance with the air-discharging ability of each of the second vents 111 and 112.

Figure 21:
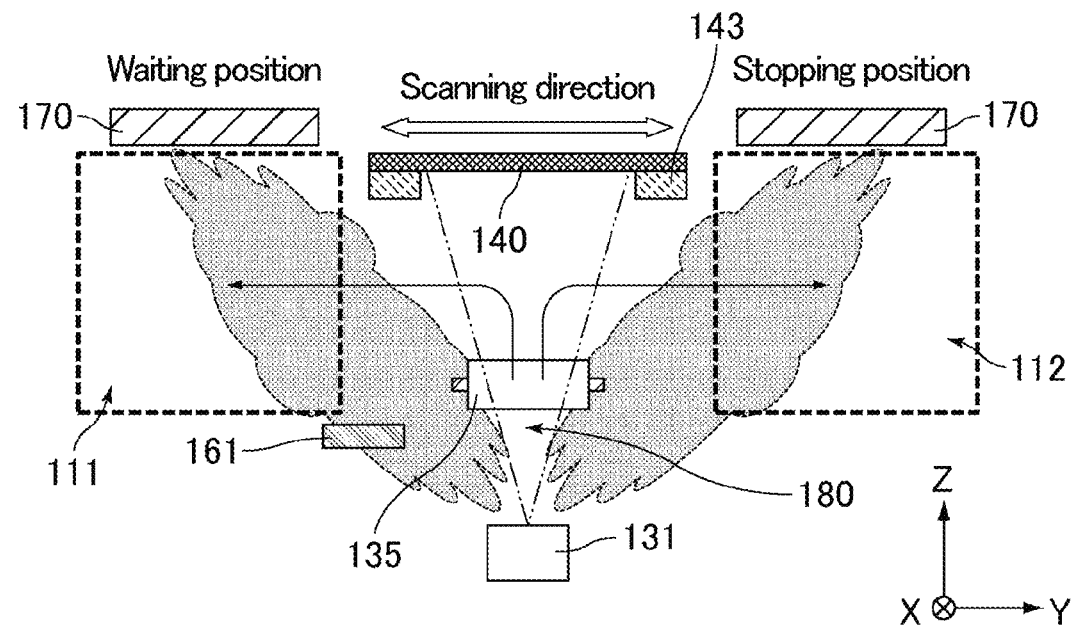
FIG. 21 is a schematic cross-sectional view of the vapor deposition device of Embodiment 1 illustrating a cross section perpendicular to the X-axis direction.
Figure 22:
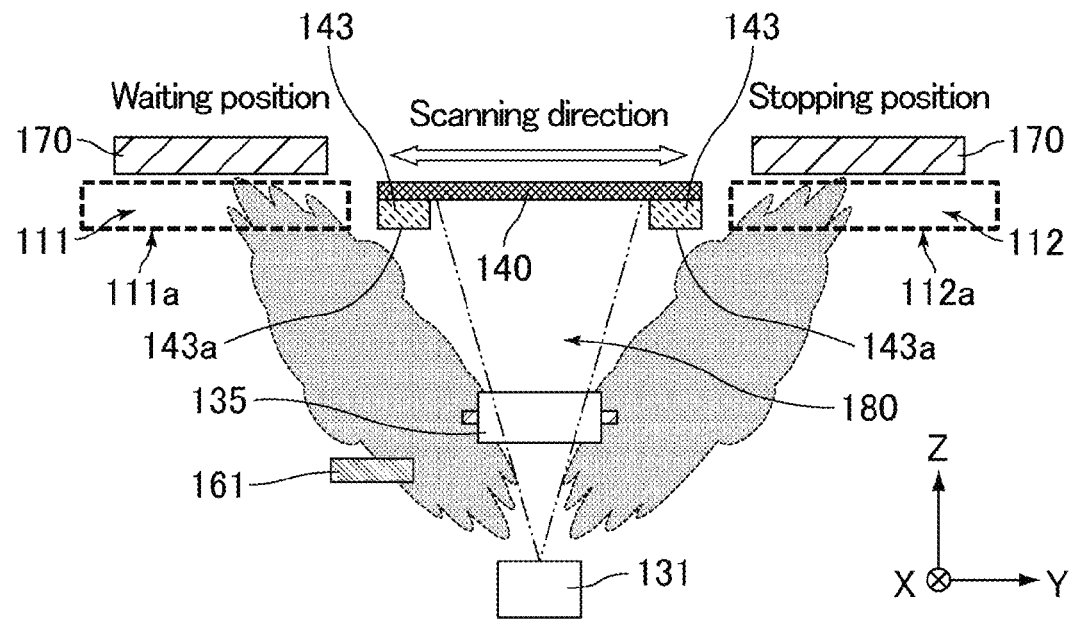
FIG. 22 is a schematic cross-sectional view of the vapor deposition device of Embodiment 1 illustrating a cross section perpendicular to the X-axis direction.

FIGS. 21 and 22 are each a schematic cross-sectional view of the vapor deposition device of Embodiment 1 illustrating a cross section perpendicular to the X-axis direction.

The second vents 111 and 112 may have any size also in the Z-axis direction. As illustrated in FIG. 21, too large second vents may disadvantageously discharge the vapor deposition particles that are to essentially reach the vapor deposition mask 140. The contaminant has only to be removed immediately before adhering to the substrate 170. Thus, as illustrated in FIG. 22, lower ends 111a and 112a of the second vents 111 and 112 are preferably at the same height as a lower end 143a of the mask frame 143 in a view in the X-axis direction. Too small second vents 111 and 112 may fail to secure a sufficient ability to discharge the contaminant.

As illustrated in the aforementioned figures, the second vents 111 and 112 each may be constituted by a single large opening. Alternatively, the second vents each may include multiple vents (sub-vents). The following will give specific examples of such a case.

FIGS. 23 to 26 are each a schematic cross-sectional view of the vapor deposition device of Embodiment 1 illustrating a cross section perpendicular to the X-axis direction.

Figure 23:
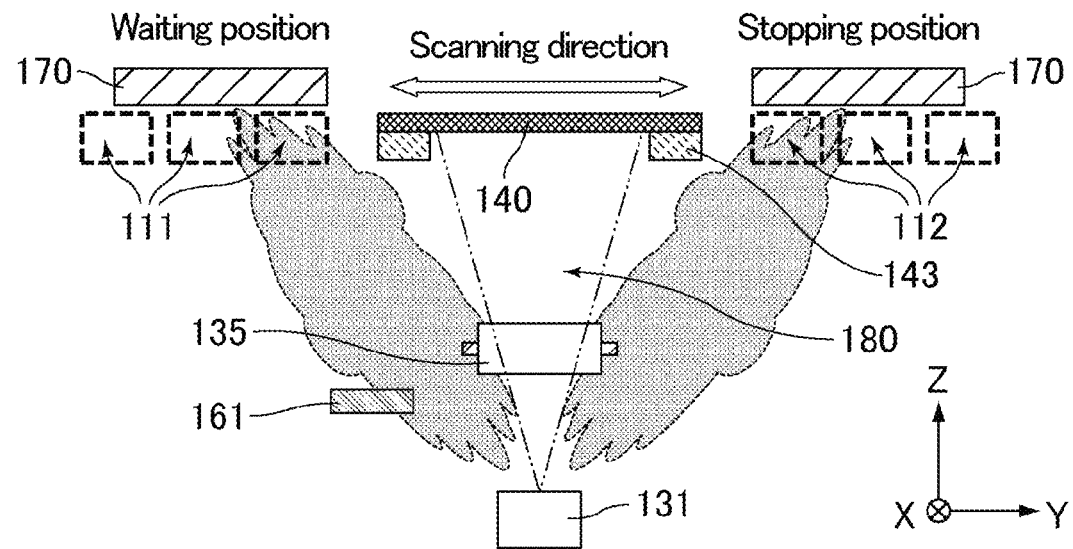
FIG. 23 is a schematic cross-sectional view of the vapor deposition device of Embodiment 1 illustrating a cross section perpendicular to the X-axis direction.
Figure 24:
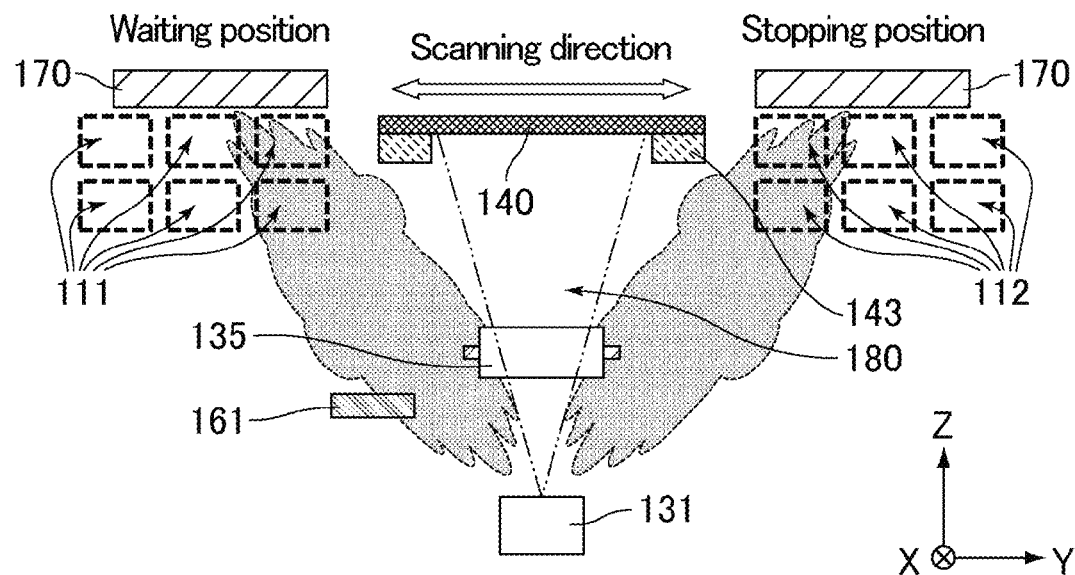
FIG. 24 is a schematic cross-sectional view of the vapor deposition device of Embodiment 1 illustrating a cross section perpendicular to the X-axis direction.

The second vents 111 and 112 each may include multiple sub-vents. The sub-vents may be arranged in a line in the Y-axis direction as illustrated in FIG. 23, or may be arranged in multiple lines in the Y-axis direction and the Z-axis direction as illustrated in FIG. 24.

Figure 25:
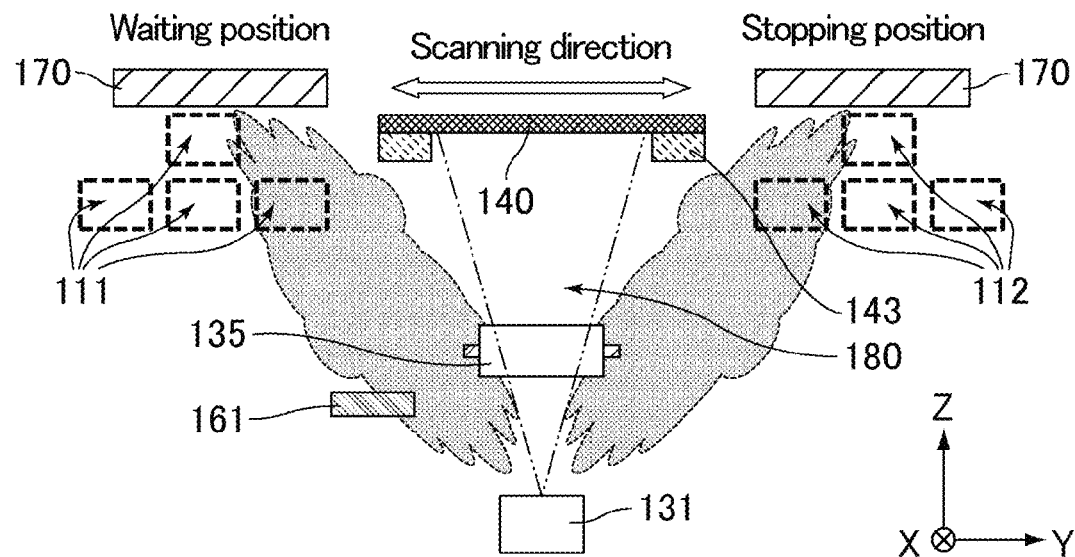
FIG. 25 is a schematic cross-sectional view of the vapor deposition device of Embodiment 1 illustrating a cross section perpendicular to the X-axis direction.

There is a large amount of the contaminant at the lower portion and there is a smaller amount thereof at the upper portion. Thus, as illustrated in FIG. 25, the number of the second vents 111 and 112 provided may increase toward the lower portion in a view in the X-axis direction. Thereby, the second vents 111 and 112 can be disposed in accordance with the amount of the contaminant, capable of more efficiently discharging the contaminant.

Figure 26:
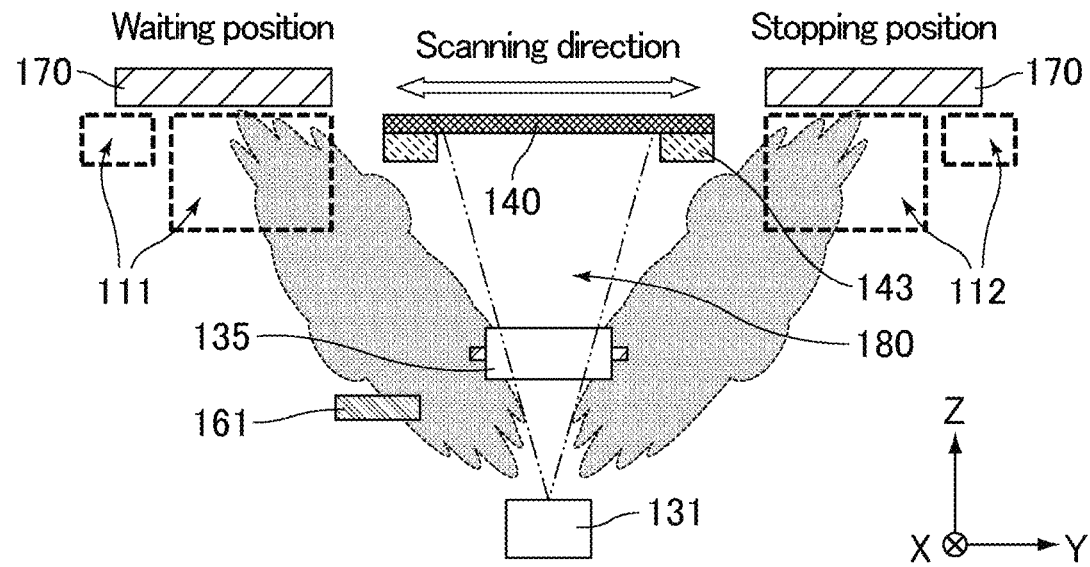
FIG. 26 is a schematic cross-sectional view of the vapor deposition device of Embodiment 1 illustrating a cross section perpendicular to the X-axis direction.

As illustrated in FIG. 26, the second vents 111 and 112 may include vents having different sizes. Thereby, those having relatively high air-discharging abilities and relatively large sizes among the second vents 111 and 112 can be disposed at portions where a larger amount of the contaminant exists and those having relatively low air-discharging abilities and relatively small sizes among the second vents 111 and 112 can be disposed at portions where a smaller amount of the contaminant exists. Therefore, the contaminant can be more effectively and more efficiently removed.

From the same point of view, as illustrated in FIG. 26, the second vents 111 may have different sizes, and a larger vent may be provided closer to the vapor deposition source 131 and a smaller vent may be provided farther from the vapor deposition source 131 among the second vents 111 in a view in the X-axis direction. Similarly, the second vents 112 may have different sizes, and a larger vent may be provided closer to the vapor deposition source 131 and a smaller vent may be provided farther from the vapor deposition source 131 among the second vents 112 in a view in the X-axis direction.

In the case of providing a plurality of the second vents 111 and 112, the respective vents are usually coupled with vacuum pumps. Still, if a sufficient discharging rate is achieved, the multiple second vents may be collectively coupled with a single vacuum pump. In the arrangements illustrated in FIGS. 23 to 25, for example, the multiple second vents 111 near the substrate inlet may be coupled with a single vacuum pump, and the multiple second vents 112 near the substrate outlet may be coupled with a single vacuum pump. This is because the amount of the vapor deposition particles flying from the vapor deposition source 131 is smaller at positions close to the substrate inlet and the substrate outlet than at the waiting position and the stopping position.

The arrangements illustrated in FIGS. 23 to 26 are mere examples, and the arrangements and/or the shapes of the second vents 111 and 112 may be appropriately changed in accordance with the conditions such as the contaminant distribution.

As mentioned above, the contaminant has a very small influence during transportation of the substrate 170, for example, during transportation from the substrate inlet 113 to the waiting position or transportation from the stopping position to the substrate outlet 114. However, this influence may not be disregarded in some cases. In order to deal with such cases, the following examples are preferred.

Figure 27:
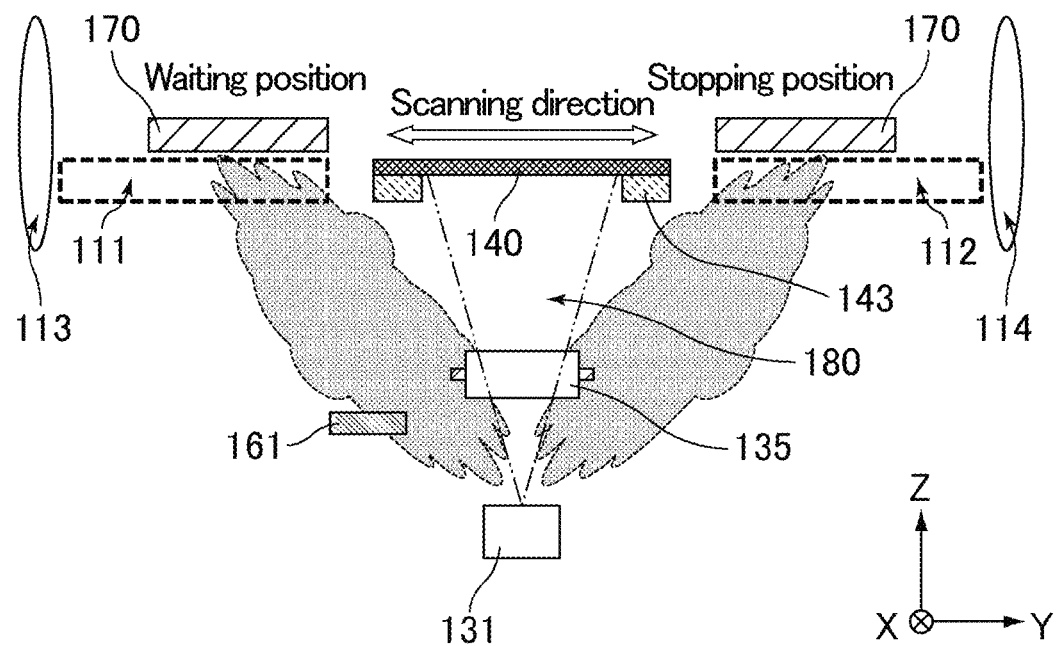
FIG. 27 is a schematic cross-sectional view of the vapor deposition device of Embodiment 1 illustrating a cross section perpendicular to the X-axis direction.
Figure 28:
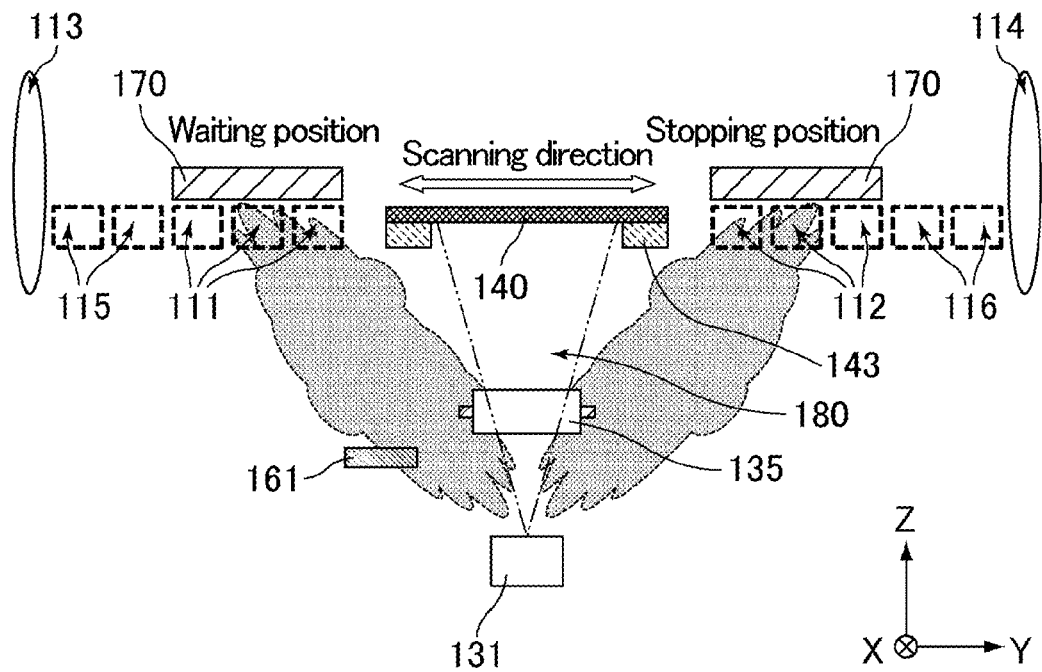
FIG. 28 is a schematic cross-sectional view of the vapor deposition device of Embodiment 1 illustrating a cross section perpendicular to the X-axis direction.
Figure 29:
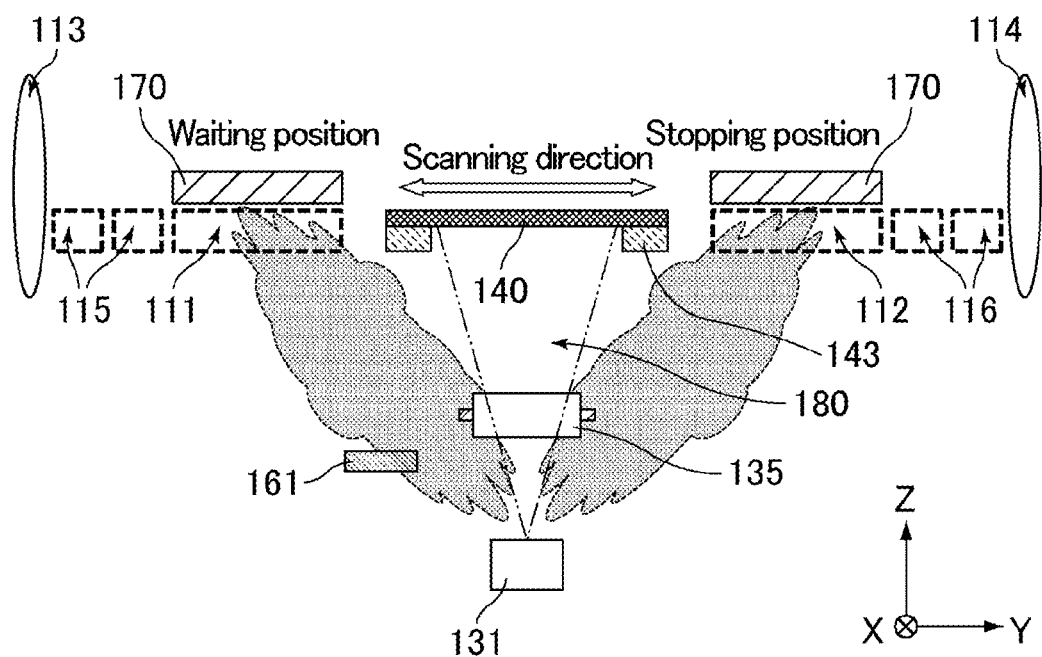
FIG. 29 is a schematic cross-sectional view of the vapor deposition device of Embodiment 1 illustrating a cross section perpendicular to the X-axis direction.

FIGS. 27 to 29 are each a schematic cross-sectional view of the vapor deposition device of Embodiment 1 illustrating a cross section perpendicular to the X-axis direction.

As illustrated in FIG. 27, when the substrate 170 is at the waiting position or the stopping position, the second vent 111 may extend toward the substrate inlet 113 from below the substrate 170, and the second vent 112 may extend toward the substrate outlet 114 from below the substrate 170, in a view in the X-axis direction. Thereby, the influence of the contaminant during transportation of the substrate 170 can be eliminated.

The example illustrated in FIG. 27 causes no disadvantages as long as a sufficient discharging rate is secured. Since the sizes of the second vents 111 and 112 are increased, the diameters of the pipes 124 and 125 also need to be increased in order not to decrease the discharging rate. Thus, as illustrated in FIG. 28, the wall 101a may be further provided with third vents 115 and 116 in addition to the second vents 111 and 112. The third vents 115 are positioned between the second vents 111 and the substrate inlet 113 and the third vents 116 are positioned between the second vents 112 and the substrate outlet 114, in a view in the X-axis direction.

Thereby, the discharging rate can be maintained without increasing the diameters of the pipes 124 and 125.

In this case, from the same point of view, a plurality of the second vents 111 and 112 may be disposed as illustrated in FIG. 28. The second vents 111 and the third vents 115 may be arranged in a line in the X-axis direction and the second vents 112 and the third vents 116 may be arranged in a line in the X-axis direction.

As illustrated in FIG. 29, one second vent 111 or 112 may be disposed below the substrate 170 at the waiting position or the stopping position and the second vents 111 and 112 each may be greater than the substrate 170 in a view in the X-axis direction. In other words, as mentioned above, when the substrate 170 is at the waiting position or the stopping position, the widths of the second vents 111 and 112 may be not smaller than the width of the substrate 170 in the Y-axis direction in a view in the X-axis direction. In the example illustrated in FIG. 28, the contaminant may disadvantageously pass through a region between adjacent second vents 111 or a region between adjacent second vents 112 to adhere to the substrate 170. Still, the structure as illustrated in FIG. 29 can eliminate such a disadvantage.

Figure 30:
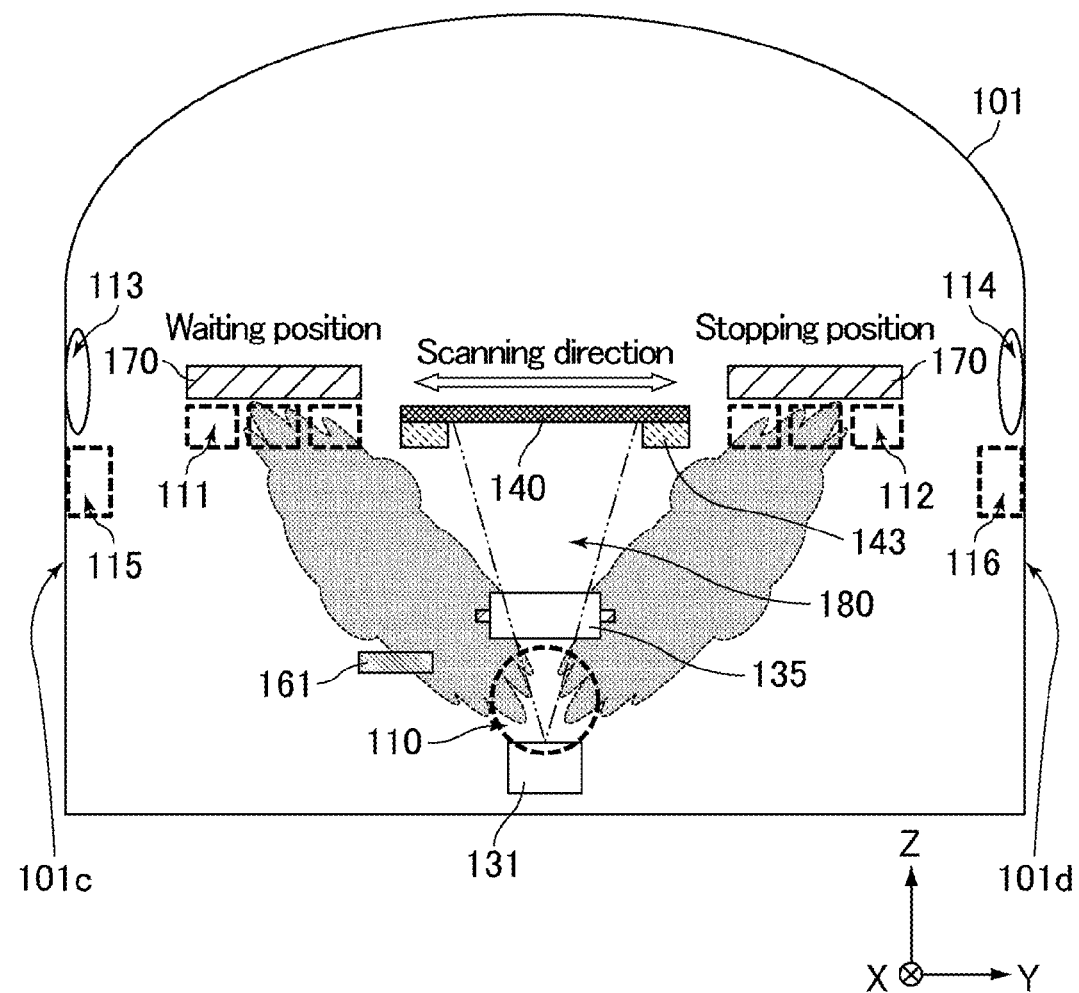
FIG. 30 is a schematic cross-sectional view of the vapor deposition device of Embodiment 1 illustrating a cross section perpendicular to the X-axis direction.

FIG. 30 is a schematic cross-sectional view of the vapor deposition device of Embodiment 1 illustrating a cross section perpendicular to the X-axis direction.

As illustrated in FIG. 30, the wall 101c may be provided with a third vent 115 or the wall 101d may be provided with a third vent 116 in addition to the second vents 111 and 112. At least part (preferably, the entire portion) of the third vent 115 is positioned below the substrate inlet 113 and at least part (preferably, the entire portion) of the third vent 116 is positioned below the substrate outlet 114. Thereby, the third vents 115 and 116 can discharge the contaminant respectively during the transportation from the substrate inlet 113 to the waiting position and the transportation from the stopping position to the substrate outlet 114.

As described hereinabove, in the present embodiment, at least part of each of the second vents 111 and 112 is below the substrate 170 when the substrate 170 is at the resting position in a view in the X-axis direction. Thus, the vapor deposition particles (contaminant) flying around the limiting member from the vapor deposition source 131 can be discharged before reaching the substrate 170. This enables production of a good organic EL element causing only a small decrease in luminance and an organic EL display device including the element.

In the present embodiment, the light-emitting layers 23R, 23G, and 23B may be formed not by multiple vapor-depositing operations but by only a single vapor-depositing operation. In this case, the substrate 170 may be scanned above the vapor deposition mask 140 so that a pattern of a vapor-deposited film may be formed, and then the workpiece may be directly transported to the substrate outlet 114 without temporary stopping at the stopping position.

If a single scanning operation fails to form a pattern of a vapor-deposited film in the entire vapor-deposition-target region 172, the vapor deposition mask 140 and/or the substrate 170 may be moved to the portion where the pattern of the vapor-deposited film is not formed in the XY plane at the stopping position and/or the waiting position. In this case, the substrate 170 may be appropriately left to remain at the stopping position and/or the waiting position for the purpose of alignment, for example.

The present embodiment is substantially the same as Embodiment 1 except that an anti-adhesion plate is provided below the substrate at the resting position. Thus, in the present embodiment, the characteristic features of the present embodiment are mainly described and the same points as in Embodiment 1 are not described. The members having the same functions have the same reference numerals in both the present embodiment and Embodiment 1, and such members are not described in the present embodiment.

In order to discharge the whole contaminant going around the limiting member from the vapor deposition source by the second vents alone, a vacuum pump having a very high discharging ability needs to be used and a heavy load is applied to such a vacuum pump. In contrast, an anti-adhesion plate cannot block the whole contaminant going around the limiting member from the vapor deposition source. This is because the anti-adhesion plate and other members form gaps and the contaminant passed through such gaps is not blocked and adheres to the substrate. Thus, it is very difficult or impossible to completely eliminate the contaminant by the second vents or the anti-adhesion plate alone. Therefore, in the present embodiment, the second vents are provided and the anti-adhesion plate is also provided.

Figure 31:
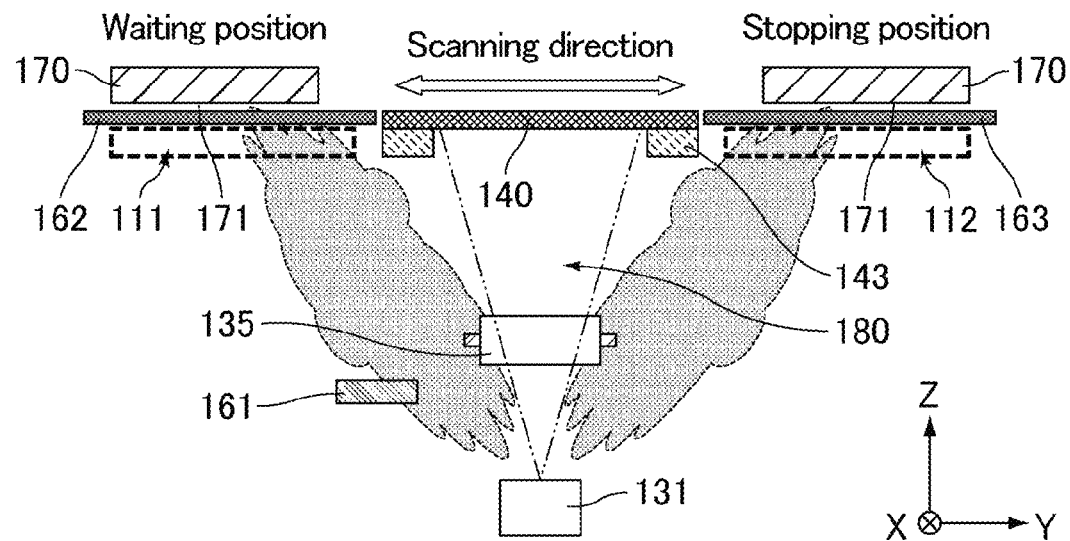
FIG. 31 is a schematic cross-sectional view of a vapor deposition device of Embodiment 2 illustrating a cross section perpendicular to the X-axis direction.

FIG. 31 is a schematic cross-sectional view of a vapor deposition device of Embodiment 2 illustrating a cross section perpendicular to the X-axis direction.

As illustrated in FIG. 31, the vapor deposition device according to the present embodiment is provided with the same second vents 111 and 112 as in Embodiment 1 and also provided with anti-adhesion plates 162 and 163. When the substrate 170 is at the waiting position, the anti-adhesion plate 162 is opposite to at least part (preferably, the entire portion) of the vapor-deposition-target surface 171 of the substrate 170. When the substrate 170 is at the stopping position, the anti-adhesion plate 163 is opposite to at least part (preferably, the entire portion) of the vapor-deposition-target surface 171 of the substrate 170. This enables more effective removal of the contaminant than in Embodiment 1.

Figure 32:
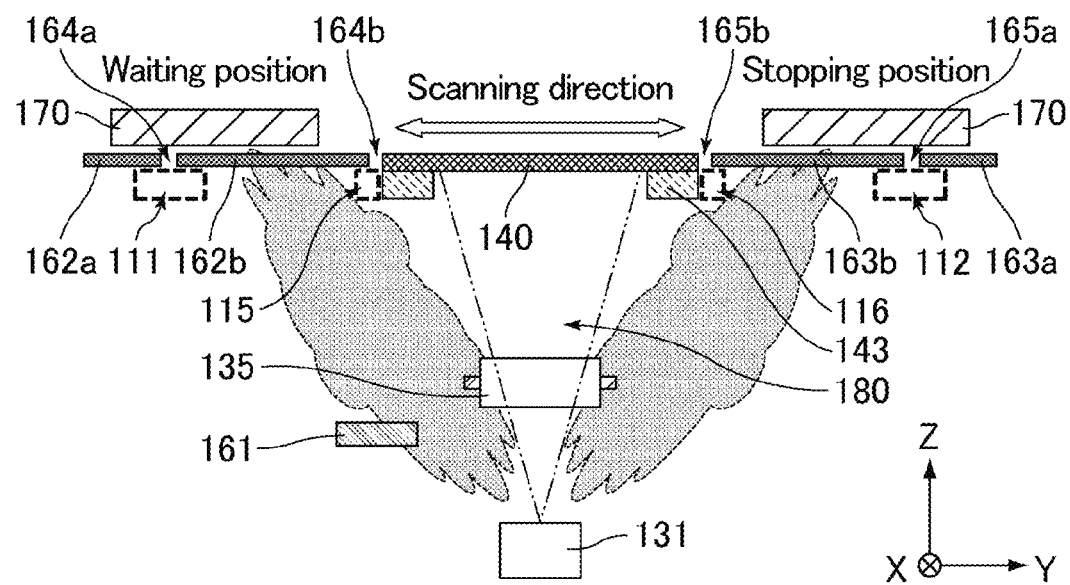
FIG. 32 is a schematic cross-sectional view of the vapor deposition device of Embodiment 2 illustrating a cross section perpendicular to the X-axis direction.

FIG. 32 is a schematic cross-sectional view of the vapor deposition device of Embodiment 2 illustrating a cross section perpendicular to the X-axis direction.

As illustrated in FIG. 32, the vapor deposition device according to the present embodiment may be provided with anti-adhesion plates 162a and 162b opposite to part of the vapor-deposition-target surface 171 of the substrate 170 at the waiting position and anti-adhesion plates 163a and 163b opposite to part of the vapor-deposition-target surface 171 of the substrate 170 at the stopping position. A gap 164a is formed between the anti-adhesion plates 162a and 162b and a gap 165a is formed between the anti-adhesion plates 163a and 163b. When the substrate 170 is at the waiting position, the gap 164a is positioned below the substrate 170. When the substrate 170 is at the stopping position, the gap 165a is positioned below the substrate 170. The second vents 111 and 112 are disposed respectively correspondingly to the gaps 164a and 165a. More specifically, at least part of the second vent 111 is positioned below the gap 164a and at least part of the second vent 112 is positioned below the gap 165a in a view in the X-axis direction. Thereby, the anti-adhesion plates 162a, 162b, 163a, and 163b can block most of the contaminant, and the second vents 111 and 112 can discharge a slight amount of the contaminant that may possibly leak through the gaps 164a and 165a. This enables more effective removal of the contaminant than in Embodiment 1. Further, the second vents 111 and 112 can be formed with minimized sizes required for removing a slight amount of the contaminant that may possibly leak through the gaps 164a and 165a. This enables more efficient removal of the contaminant than with the structure illustrated in FIG. 31.

A gap 164b and a gap 165b are inevitably formed respectively between the anti-adhesion plate 162b and the mask frame 143 and between the anti-adhesion plate 163b and the mask frame 143. The third vents 115 and 116 are disposed correspondingly to these gaps 164b and 165b.

Similar to the second vents 111 and 112, the third vents 115 and 116 are provided in the wall 101a that is a wall adjacent to the vapor deposition unit 130 in the X-axis direction and is disposed along the YZ plane. At least part of the third vent 115 is positioned below the gap 164b and at least part of the third vent 116 is positioned below the gap 165b in a view in the X-axis direction. Thereby, the third vents 115 and 116 can discharge a slight amount of the contaminant that may possibly leak through the gaps 164b and 165b. This enables further effective removal of the contaminant. Further, the third vents 115 and 116 can be formed with minimized sizes required for removing a slight amount of the contaminant that may possibly leak through the gaps 164b and 165b. This enables sufficient reduction in possibility of disadvantageously discharging the vapor deposition particles that are essentially to reach the substrate 170 through the vapor deposition mask 140.

Figure 33:
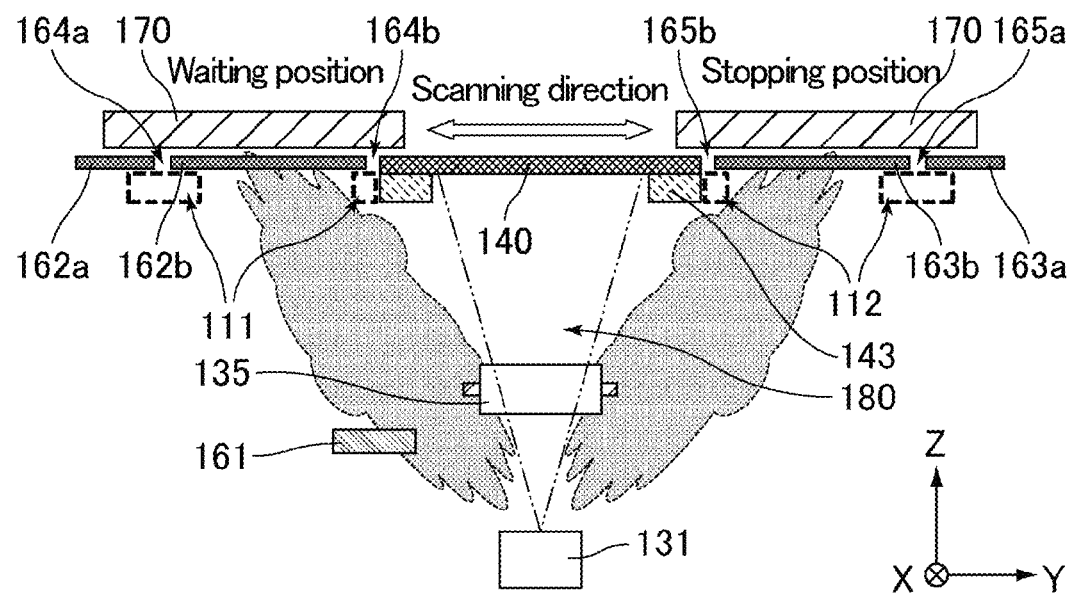
FIG. 33 is a schematic cross-sectional view of the vapor deposition device of Embodiment 2 illustrating a cross section perpendicular to the X-axis direction.

FIG. 33 is a schematic cross-sectional view of the vapor deposition device of Embodiment 2 illustrating a cross section perpendicular to the X-axis direction.

As illustrated in FIG. 33, an end of the substrate 170 may overlap the vapor deposition mask 140 when the substrate 170 is at the waiting position or the stopping position in the present embodiment, similar to the case as illustrated in FIG. 12. In this case, a plurality of the second vents 111 and a plurality of the second vents 112 may be provided. The second vents 111 may include a vent positioned below the gap 164a and a vent positioned below the gap 164b in a view in the X-axis direction. The second vents 112 may include a vent positioned below the gap 165a and a vent positioned below the gap 165b in a view in the X-axis direction. This also enables the same effects as in the case illustrated in FIG. 32.

As mentioned above, the gaps 164b and 165b are inevitably formed. The reason of this is as follows.

The mask frame is welded with the vapor deposition mask. In contrast, the anti-adhesion plates are assembled as mechanisms of the vapor deposition device, and thus are formed separately from the mask frame. In order to eliminate the gaps, the mask frame and the anti-adhesion plates need to be produced integrally, which is not practical. This is because as follows. Specifically, the mask frame is required for each vapor deposition mask. If the mask frame and the anti-adhesion plates are integrated, the anti-adhesion plates are also required for each vapor deposition mask, which increases the cost. Further, the anti-adhesion plates need to be washed regularly. If the components are integrated, the vapor deposition mask also inevitably needs to be washed, which causes a possibility of defects such as deterioration of the mask due to the washing. Therefore, integral production of the mask frame and the anti-adhesion plates causes various demerits, which is thus impractical.

In the structure illustrated in FIG. 32, the second vents 111 and 112 and the third vents 115 and 116 are respectively provided below the anti-adhesion plates 162a, 162b, 163a, and 163b. Still, the second vents 111 and 112 and the third vents 115 and 116 may respectively be provided above the anti-adhesion plates 162a, 162b, 163a, and 163b.

Figure 34:
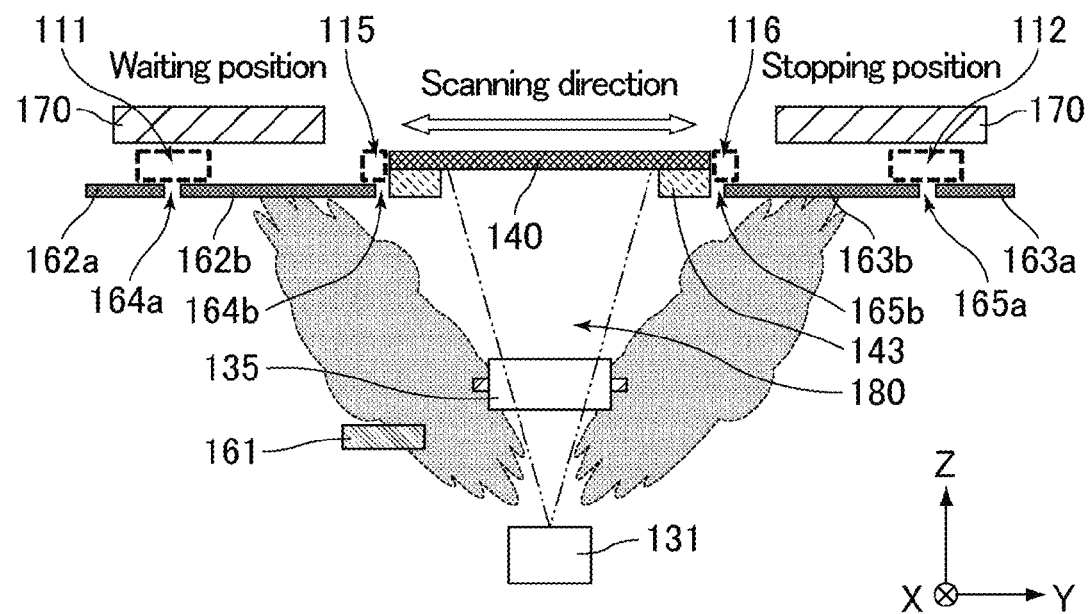
FIG. 34 is a schematic cross-sectional view of the vapor deposition device of Embodiment 2 illustrating a cross section perpendicular to the X-axis direction.

FIG. 34 is a schematic cross-sectional view of the vapor deposition device of Embodiment 2 illustrating a cross section perpendicular to the X-axis direction.

As illustrated in FIG. 34, when the substrate 170 is at the waiting position, at least part of the second vent 111 may be positioned above the gap 164a and between the substrate 170 and the gap 164a in a view in the X-axis direction. When the substrate 170 is at the stopping position, at least part of the second vent 112 may be positioned above the gap 165a and between the substrate 170 and the gap 165a in a view in the X-axis direction. Further, at least part of the third vent 115 may be positioned above the gap 164b and at least part of the third vent 116 may be above the gap 165b in a view in the X-axis direction. Thereby, the anti-adhesion plates 162a, 162b, 163a, and 163b can block most of the contaminant, and then the second vents 111 and 112 and the third vents 115 and 116 can discharge a slight amount of the contaminant that may possibly leak through the gaps 164a, 165a, 164b, and 165b, which is closer to the spirit of the present embodiment, i.e., complementary working between the anti-adhesion plates and the second and third vents.

In the structure illustrated in FIG. 33, each of the second vents 111 and 112 is provided below the anti-adhesion plates 162a, 162b, 163a, and 163b. Still, each of the second vents 111 and 112 may be provided above the anti-adhesion plates 162a, 162b, 163a, and 163b.

Figure 35:
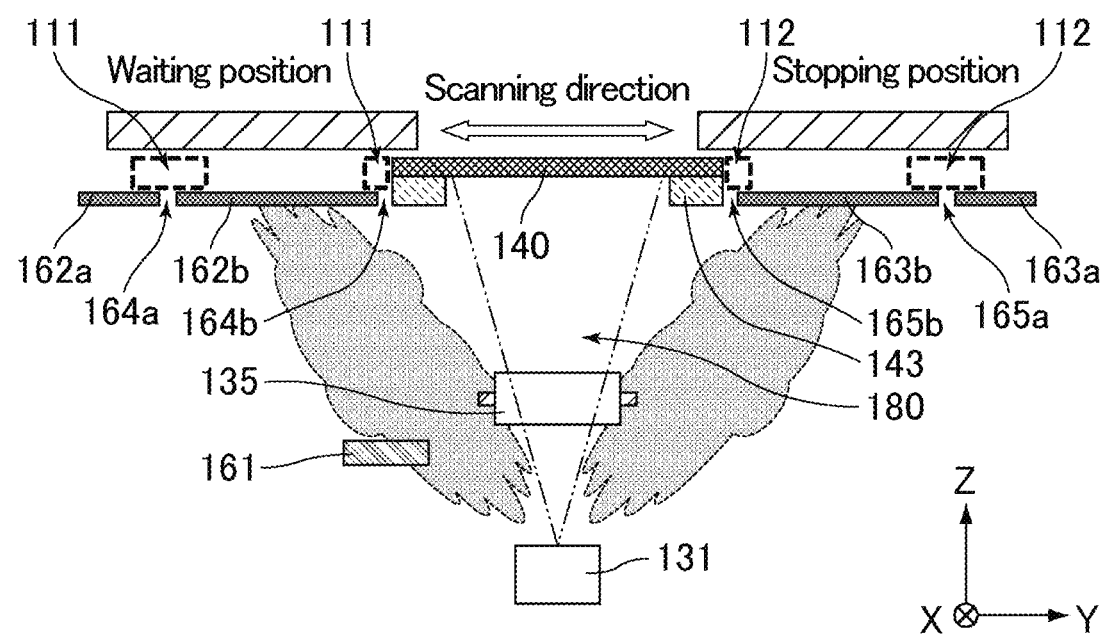
FIG. 35 is a schematic cross-sectional view of the vapor deposition device of Embodiment 2 illustrating a cross section perpendicular to the X-axis direction.

FIG. 35 is a schematic cross-sectional view of the vapor deposition device of Embodiment 2 illustrating a cross section perpendicular to the X-axis direction.

As illustrated in FIG. 35, an end of the substrate 170 may overlap the vapor deposition mask 140 when the substrate 170 is at the waiting position or the stopping position. In this case, a plurality of the second vents 111 and a plurality of the second vents 112 may be provided. The second vents 111 may include a vent positioned above the gap 164a and between the substrate 170 and the gap 164a and a vent positioned above the gap 164b and between the substrate 170 and the gap 164b in a view in the X-axis direction. The second vents 112 may include a vent positioned above the gap 165a and between the substrate 170 and the gap 165a and a vent positioned above the gap 165b and between the substrate 170 and the gap 165b in a view in the X-axis direction. This also enables the same effects as achieved by the structure illustrated in FIG. 34.

From the same viewpoint as in Embodiment 1, the anti-adhesion plates are also preferably extended to reach the substrate inlet or the substrate outlet in the present embodiment.

Instead of disposing the anti-adhesion plate, a protrusion may partially protrude from a wall of the vapor deposition chamber.

Figure 36:
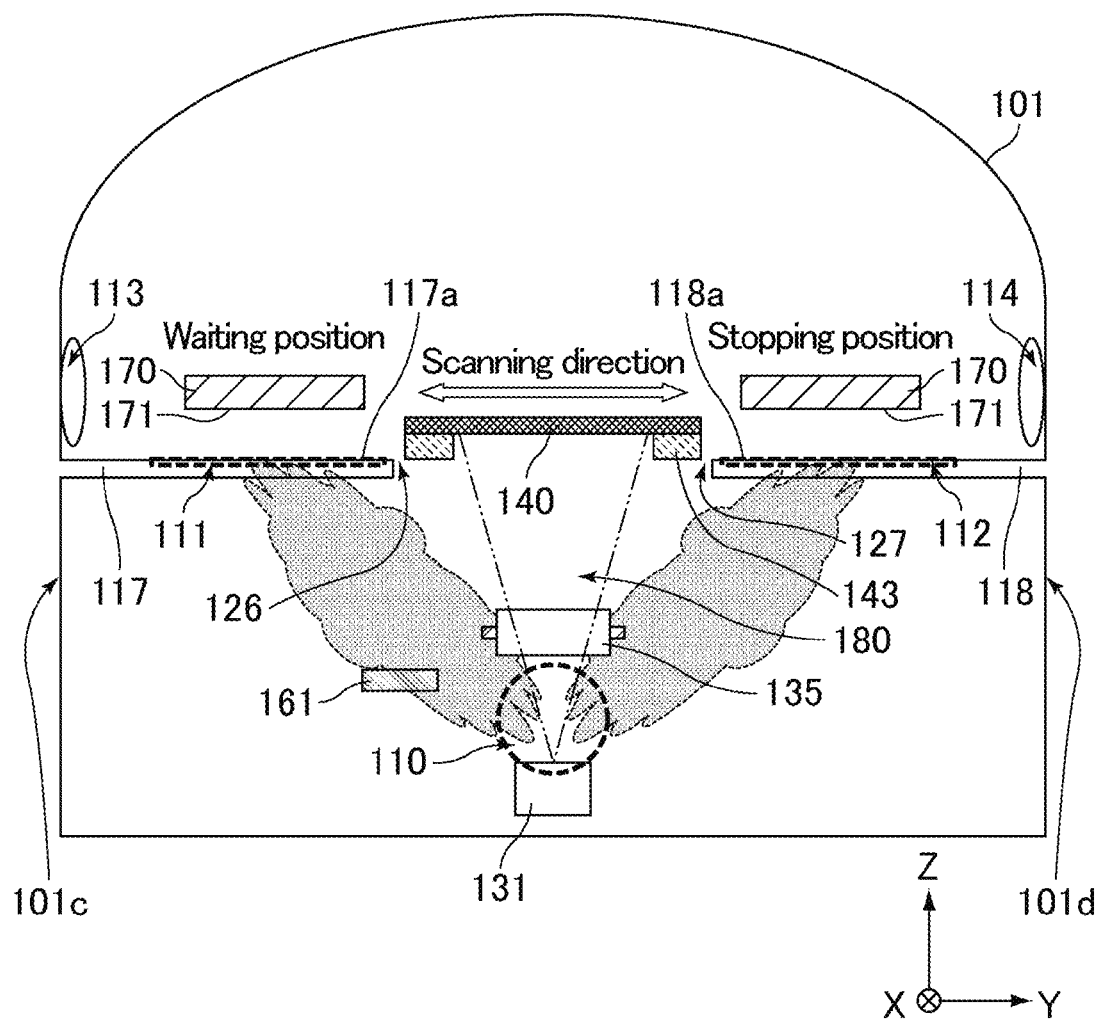
FIG. 36 is a schematic cross-sectional view of the vapor deposition device of Embodiment 2 illustrating a cross section perpendicular to the X-axis direction.

FIG. 36 is a schematic cross-sectional view of the vapor deposition device of Embodiment 2 illustrating a cross section perpendicular to the X-axis direction.

As illustrated in FIG. 36, the vapor deposition device of the present embodiment may include a protrusion 117 that protrudes from a part of the wall 101c of the vapor deposition chamber 101 and a protrusion 118 that protrudes from a part of the wall 101d of the vapor deposition chamber 101. The protrusion 117 extends from below the substrate inlet 113 to the vicinity of the vapor deposition mask 140, and the protrusion 118 extends from below the substrate outlet 114 to the vicinity of the vapor deposition mask 140. When the substrate 170 is at the waiting position, at least part (preferably, the entire portion) of the vapor-deposition-target surface 171 of the substrate 170 is opposite to the protrusion 117. When the substrate 170 is at the stopping position, at least part (preferably, the entire portion) of the vapor-deposition-target surface 171 of the substrate 170 is opposite to the protrusion 118.

The second vent 111 is provided in a surface 117a that is a surface of the protrusion 117 and that is opposite to the vapor-deposition-target surface 171 of the substrate 170 at the waiting position. The second vent 12 is provided in a surface 118a that is a surface of the protrusion 118 and that is opposite to the vapor-deposition-target surface 171 of the substrate 170 at the stopping position. The respective second vents 111 and 112 are coupled with vacuum pumps (not illustrated) through pipes (not illustrated) provided inside the protrusions 117 and 118. Unlike Embodiment 1, the second vents 111 and 112 actually exist below the substrate 170 at the waiting position and at the stopping position. Similar to Embodiment 1, at least part of the second vent 111 is positioned below the substrate 170 when the substrate 170 is at the waiting position in a view in the X-axis direction, and at least part of the second vent 112 is positioned below the substrate 170 when the substrate 170 is at the stopping position in a view in the X-axis direction.

For the same reasons as in the case of providing the anti-adhesion plates, a gap 126 and a gap 127 exist respectively between the protrusion 117 and the mask frame 143 and between the protrusion 118 and the mask frame 143. With the above structure, the protrusions 117 and 118 can block most of the contaminant and the second vents 111 and 112 can discharge a slight amount of the contaminant leaked through the gaps 126 and 127. This enables more effective removal of the contaminant than in Embodiment 1.

Figure 37:
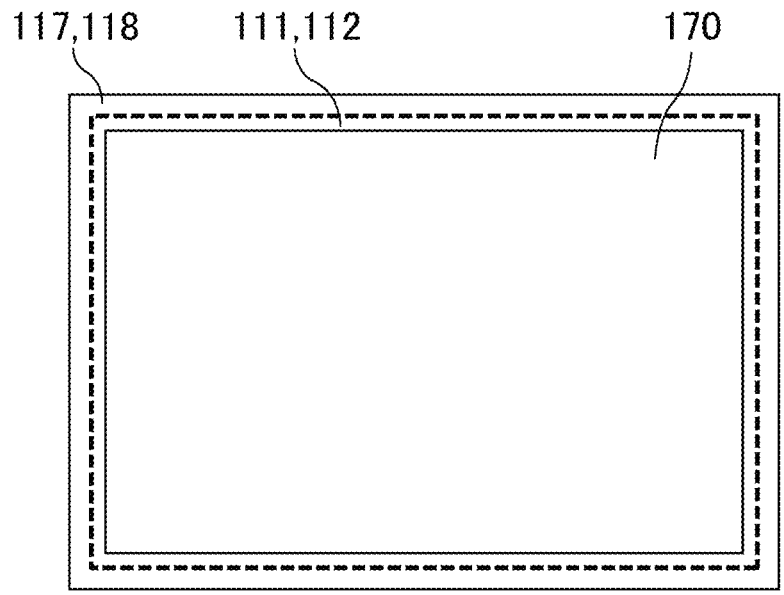
FIG. 37 is a schematic view of the vapor deposition device of Embodiment 2 in a view observed in the Z-axis direction.
Figure 38:
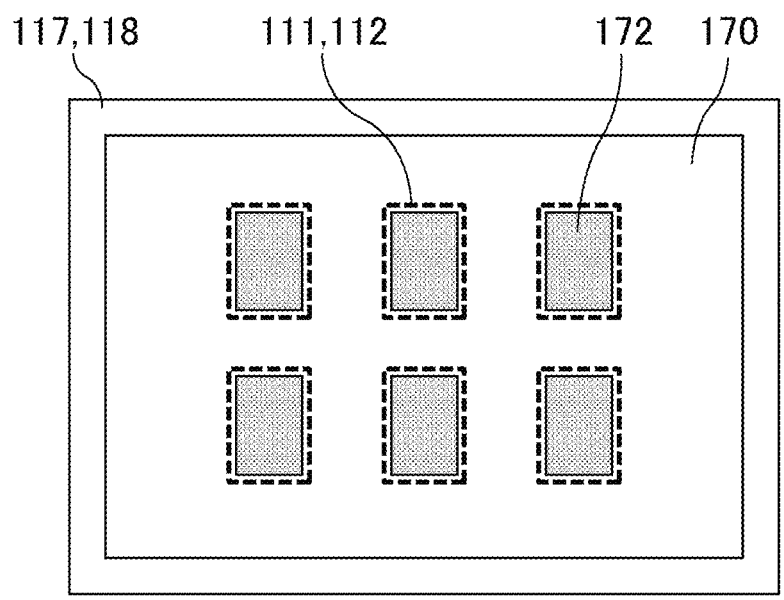
FIG. 38 is a schematic view of the vapor deposition device of Embodiment 2 in a view observed in the Z-axis direction.

FIGS. 37 and 38 are each a schematic view of the vapor deposition device of Embodiment 2 in a view observed in the Z-axis direction.

In order to effectively block the contaminant, the protrusions 117 and 118 each preferably have the same size as the substrate 170 or a greater size than the substrate 170, and preferably overlap the whole substrate 170 at the waiting position or the stopping position, as illustrated in FIG. 37. Also, as illustrated in FIG. 37, the second vents 111 and 112 each may have the same size as the substrate 170 or a greater size than the substrate 170, and may overlap the whole substrate 170 at the waiting position or the stopping position. This case may highly possibly fail to secure the discharging ability, but most of the contaminant can be made to adhere to the protrusions 117 and 118. Thus, in order to secure the discharging ability and to achieve efficient removal of the contaminant simultaneously, the second vents 111 and 112 each may have the same size as the vapor-deposition-target region 172 and may be provided correspondingly to the vapor-deposition-target region 172 of the substrate 170 at the waiting position or the stopping position, as illustrated in FIG. 38. From the same point of view, a plurality of the vapor-deposition-target regions 172 may be provided and the second vents 111 and 112 may be provided correspondingly to the respective vapor-deposition-target regions 172. This configuration is suitable for the case of providing multiple panel regions on the substrate 170, and the vapor-deposition-target regions 172 correspond to the respective panel regions.

Figure 39:
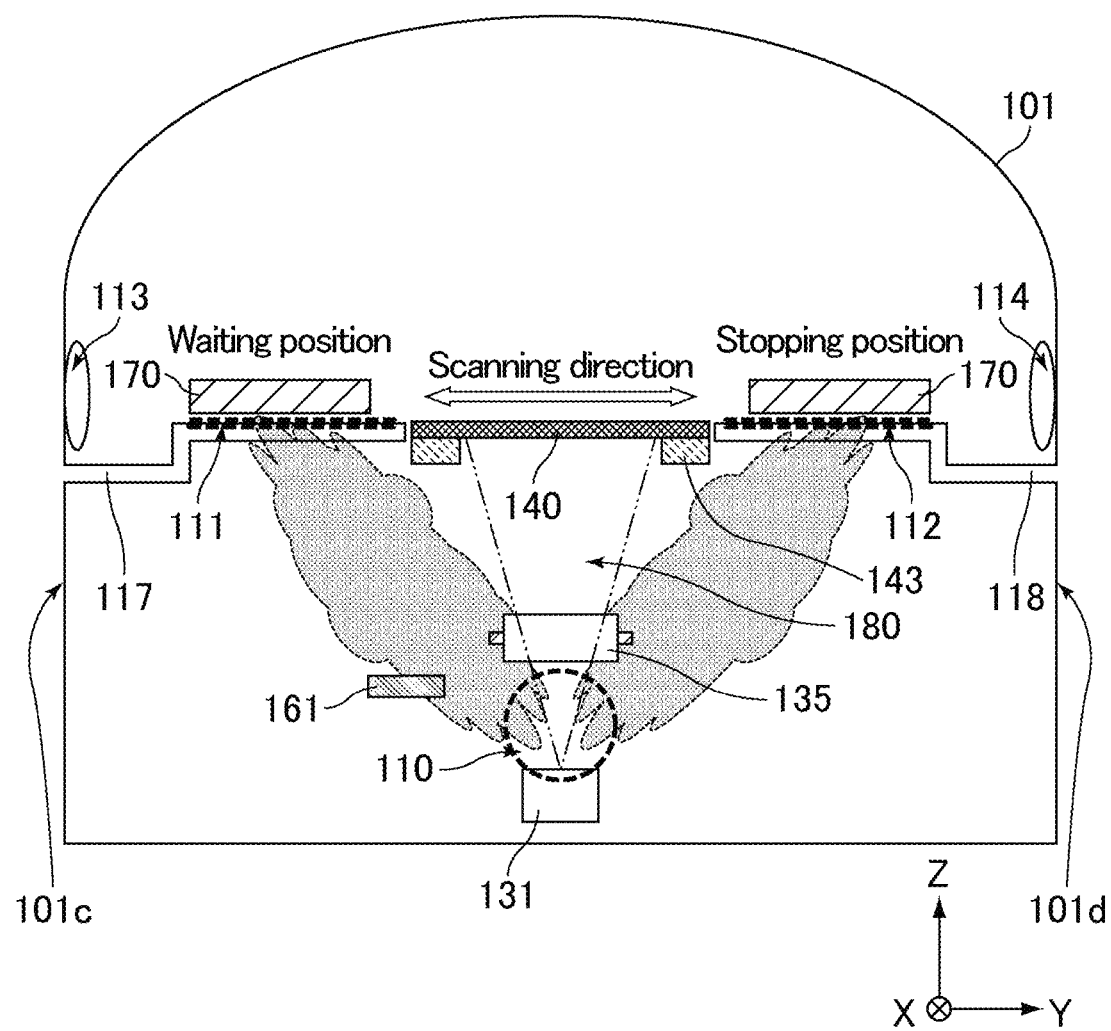
FIG. 39 is a schematic cross-sectional view of the vapor deposition device of Embodiment 2 illustrating a cross section perpendicular to the X-axis direction.

FIG. 39 is a schematic cross-sectional view of the vapor deposition device of Embodiment 2 illustrating a cross section perpendicular to the X-axis direction.

As illustrated in FIG. 39, the distance between the protrusion 117 and the substrate 170 at the waiting position may be shorter than the distance between the protrusion 117 and the substrate 170 when passing through the substrate inlet 113. Similarly, the distance between the protrusion 118 and the substrate 170 at the stopping position may be shorter than the distance between the protrusion 118 and the substrate 170 when passing through the substrate outlet 114. This secures spaces for the operations of delivering the substrate 170 by an arm (not illustrated) in the vicinity of the substrate inlet 113 and the substrate outlet 114, and also makes the distances narrow between the substrate 170 at the stopping position and the protrusion 117 and between the substrate 170 at the waiting position and the protrusion 118, so that the contaminant is much less likely to reach the substrate 170 at the waiting position or the stopping position.

In the case of providing the protrusions 117 and 118, the second vents 111 and 112 may be provided not in the protrusions 117 and 118 but in the wall 101a in the same manner as in the case of providing the anti-adhesion plates. For example, in the structure illustrated in FIG. 31, protrusions with no second vents may be disposed instead of the anti-adhesion plates 162 and 163. Also, in the structures illustrated in FIGS. 32 to 35, a protrusion with no second vent may be disposed instead of the anti-adhesion plates 162a and 162b, a protrusion with no second vent may be disposed instead of the anti-adhesion plates 163a and 163b, and second or third vents may be provided in the wall 101a correspondingly to the gaps (equivalent to the gaps 164b and 165b in FIGS. 32 to 35) between each protrusion and the mask frame 143.

The present embodiment is substantially the same as Embodiment 1 except that the layout of vents is changed. Thus, in the present embodiment, the characteristic features of the present embodiment are mainly described and the same points as in Embodiment 1 are not described. The members having the same functions have the same reference numerals in both the present embodiment and Embodiment 1, and such members are not described in the present embodiment.

Embodiments 1 and 2 aim to remove the contaminant going around the limiting member from the vapor deposition source, in other words, flying from the contaminant source below the substrate. In addition to the contaminant derived from the vapor-deposition material, the members used inside the vapor deposition chamber may also highly possibly generate a contaminant. For example, grease is usually used so as to make smooth the mechanisms such as a transport mechanism for transporting the substrate and an elevating mechanism for aligning the substrate and the mask. Thus, a contaminant source other than the vapor-deposition material, such as grease, may also exist above the substrate. This contaminant flying from the contaminant source above the substrate may possibly not only adhere to the backside (surface opposite to the vapor-deposition-target surface) of the substrate but also go around the substrate and adhere to the vapor-deposition-target surface of the substrate. Thus, in the present embodiment, a vent is also provided above the substrate.

Figure 40:
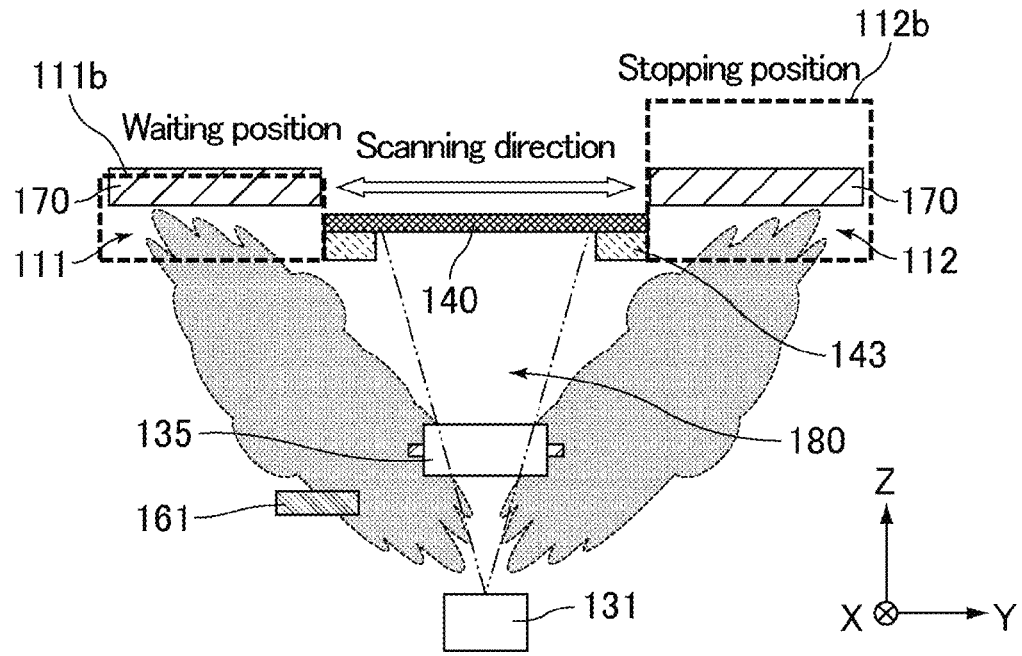
FIG. 40 is a schematic cross-sectional view of a vapor deposition device of Embodiment 3 illustrating a cross section perpendicular to the X-axis direction.

FIG. 40 is a schematic cross-sectional view of a vapor deposition device of Embodiment 3 illustrating a cross section perpendicular to the X-axis direction.

As illustrated in FIG. 40, when the substrate 170 is at the resting position, upper ends 111b and 112b of the second vents 111 and 112 overlap the substrate 170 or above the substrate 170 in a view in the X-axis direction. This enables the second vents 111 and 112 to discharge the contaminant flying from the contaminant source above the substrate 170. From the same point of view, when the substrate 170 is at the resting position, part of the second vents 111 and 112 may overlap the substrate 170 in a view in the X-axis direction.

In this case, however, the second vents 111 and 112 are large and thus may disadvantageously have a decreased discharging rate. Thus, the structure illustrated in FIG. 41 may be used.

Figure 41:
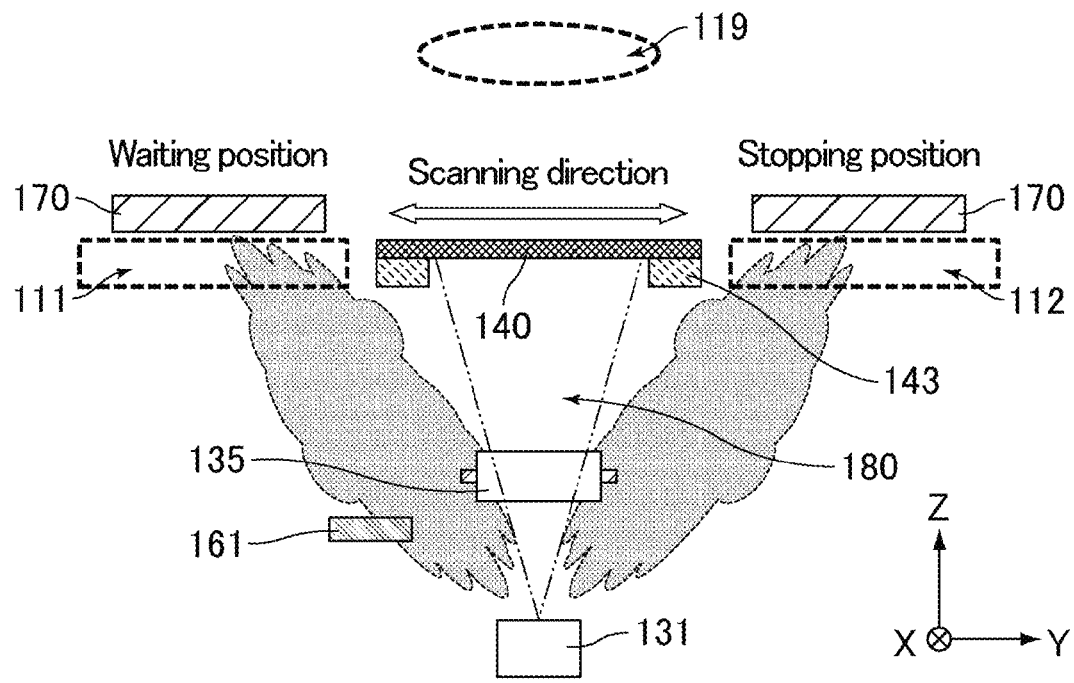
FIG. 41 is a schematic cross-sectional view of the vapor deposition device of Embodiment 3 illustrating a cross section perpendicular to the X-axis direction.

FIG. 41 is a schematic cross-sectional view of the vapor deposition device of Embodiment 3 illustrating a cross section perpendicular to the X-axis direction.

As illustrated in FIG. 41, a third vent 119 may be provided in the vapor deposition chamber 101 in addition to the second vents 111 and 112, and the third vent 119 may be disposed above the substrate 170 at the resting position. Thereby, the contaminant below the substrate 170 can be discharged through the second vents 111 and 112 and the contaminant above the substrate 170 can be discharged through the third vent 119. As mentioned above, splitting the function of removing the upper and lower contaminants between the third vent 119 and the second vents 111 and 112 makes it possible to efficiently discharge the upper and lower contaminants and to prevent a decrease in discharging rate.

The third vent 119 may be disposed at any position that is above the substrate 170 at the resting position. The third vent 119 may be disposed in the ceiling 101f of the vapor deposition chamber 101 as illustrated in FIG. 41, or may be disposed in any of the walls of the vapor deposition chamber 101. The third vent 119 may be locally disposed around the contaminant source, or may be disposed in the entire ceiling 101f of the vapor deposition chamber 101. Similar to the second vents, a plurality of the third vents (sub-vents) may be provided.

Although neither an anti-adhesion plate nor a protrusion is provided in FIG. 41, the third vent 119 may be used together with an anti-adhesion plate or a protrusion, of course.

There may naturally exist contaminant sources (e.g., grease) other than the vapor-deposition material below the substrate 170. Still, needless to say, the second vents and/or the anti-adhesion plates can treat such contaminants.

The following will describe other modified examples in Embodiments 1 to 3.

An organic EL display device manufactured using the vapor deposition device of any of the present embodiments may be a monochrome display device and the respective pixels may not be divided into multiple sub-pixels. In this case, a light-emitting material of one color may be vapor-deposited and a light-emitting layer of one color alone may be formed in the step of vapor-depositing a light-emitting layer.

In the vapor deposition steps other than the step of vapor-depositing a light-emitting layer, a thin film pattern may be formed in the same manner as in the step of vapor-depositing a light-emitting layer. For example, an electron-transport layer may be formed for each of the sub-pixels of the respective colors.

Further, Embodiments 1 to 3 are described referring to examples in which a light-emitting layer of an organic EL element is formed. Still, the use of the vapor deposition device according to the present invention should not be limited to manufacturing of an organic EL element, and the vapor deposition device may be used in formation of various thin-film patterns.

The aforementioned embodiments may be employed in any appropriate combination as long as the combination is not beyond the spirit of the present invention. The modified examples of the respective embodiments may be combined with any other embodiments.

REFERENCE SIGNS LIST

1: organic EL display device
2: pixel
2R, 2G, 2B: sub-pixel
10: TFT substrate
11: insulating substrate
12: TFT
13: interlayer film
13a: contact hole
14: conductive line
15: edge cover
15R, 15G, 15B: opening
20: organic EL element
21: first electrode
22: hole-injection/hole-transport layer (organic layer)
23R, 23G, 23B: light-emitting layer (organic layer)
24: electron-transport layer (organic layer)
25: electron-injection layer (organic layer)
26: second electrode
30: adhesive layer
40: sealing substrate
100: vapor deposition device
101: vapor deposition chamber
101a, 101b, 101c, 101d: wall
101e: floor
101f: ceiling
102: substrate holder
103: substrate transporting device
104: vapor deposition unit transporting device
105: image sensor
106, 107: arm
108: transport mechanism
110: first vent
111, 112: second vent
111a, 112a: lower end
111b, 112b: upper end
113: substrate inlet
114: substrate outlet
115, 116, 119: third vent
117, 118: protrusion
117a, 118a: surface
120 to 122: vacuum pump
123 to 125: pipe
126, 127: gap
130: vapor deposition unit
131: vapor deposition source
132: nozzle
133: injection port
134: limiting member
135: limiting plate
136: holding member
137: supporting member
138: limiting space
140: vapor deposition mask
141: opening
142: alignment marker
143: mask frame
143a: lower end
144: opening region
150: holder
151: sliding device
152: supporting member
153: tension mechanism
160: anti-adhesion plate
161: shutter
162, 163, 162a, 162b, 163a, 163b: anti-adhesion plate
164a, 165a, 164b, 165b: gap
170: substrate
171: vapor-deposition-target surface
172: vapor-deposition-target region
173: non-vapor-deposition region 174, 175: space
176: alignment marker
180: vapor deposition stream
181: vapor-deposited film

The invention claimed is:

1. A vapor deposition device for forming a film on a substrate, comprising:
a vapor deposition chamber;
a vapor deposition unit including a vapor deposition mask provided with an opening for pattern formation; and
a transport mechanism that is configured to transfer at least one of the substrate and the vapor deposition unit relative to the other in a first direction perpendicular to a normal direction of the vapor deposition mask and that is configured to cause the substrate to rest temporarily at a resting position relative to the vapor deposition unit,
the substrate including a vapor-deposition-target region, the region not overlapping the opening of the vapor deposition mask when the substrate is at the resting position,
the vapor deposition chamber being provided with a first vent and a second vent,
when the substrate is at the resting position, at least part of the second vent being positioned below the substrate and the resting position in a view in a second direction that is perpendicular to the normal direction and the first direction.

2. The vapor deposition device of claim 1,
wherein, when the substrate is at the resting position, the second vent has a width that is not smaller than a width of the substrate in the first direction in a view in the second direction.

3. The vapor deposition device of claim 1,
wherein the second vent is positioned apart from the vapor deposition mask in a view in the second direction.

4. The vapor deposition device of claim 1,
wherein the vapor deposition unit includes a mask frame that supports the vapor deposition mask, and
the second vent has a lower end positioned at a same height as a lower end of the mask frame.

5. The vapor deposition device of claim 1,
wherein the vapor deposition chamber comprises a plurality of the second vents,
the vapor deposition chamber includes a wall adjacent to the vapor deposition unit in the second direction,
the second vents are provided in the wall, and
the number of the second vents provided increases toward the lower side in a view in the second direction.

6. The vapor deposition device of claim 1,
wherein the vapor deposition chamber comprises a plurality of the second vents, and
the second vents have different sizes.

7. The vapor deposition device of claim 6,
wherein the vapor deposition unit includes a vapor deposition source, and
a vent greater in size among the plurality of second vents is provided closer to the vapor deposition source and a vent smaller in size among the plurality of second vents is provided farther from the vapor deposition source in a view in the second direction.

8. The vapor deposition device of claim 1, further comprising an anti-adhesion plate,
wherein, when the substrate is at the resting position, at least part of a vapor-deposition-target surface of the substrate is opposite to the anti-adhesion plate.

9. The vapor deposition device of claim 8,
wherein the vapor deposition chamber comprises a plurality of the anti-adhesion plates,
the plurality of anti-adhesion plates define a gap therebetween, and
at least part of the second vent is positioned below or above the gap in a view in the second direction.

10. The vapor deposition device of claim 8,
wherein the vapor deposition unit includes a mask frame that supports the vapor deposition mask,
the mask frame is disposed so as to define a gap with the anti-adhesion plate,
the vapor deposition chamber is provided with a third vent, and
at least part of the third vent is positioned below or above the gap in a view in the second direction.

11. The vapor deposition device of claim 1,
wherein the vapor deposition chamber includes a protrusion that protrudes from part of the wall,
the vapor deposition chamber is provided with a substrate inlet and a substrate outlet,
the protrusion extends from below the substrate inlet or the substrate outlet to the vicinity of the vapor deposition mask,
when the substrate is at the resting position, at least part of a vapor-deposition-target surface of the substrate is opposite to the protrusion, and
the second vent is provided in a surface that is a surface of the protrusion and is opposite to the vapor-deposition-target surface of the substrate at the resting position.

12. The vapor deposition device of claim 11,
wherein a distance between the protrusion and the substrate at the resting position is smaller than a distance between the protrusion and the substrate passing through the substrate inlet or the substrate outlet.

13. The vapor deposition device of claim 1,
wherein the vapor deposition chamber is provided with a third vent, and
the third vent is positioned higher than the substrate at the resting position.

14. A vapor deposition method comprising
a vapor deposition step of forming a thin film pattern on a substrate,
the vapor deposition step being performed using the vapor deposition device of claim 1.

15. An organic electroluminescence element manufacturing method comprising
a vapor deposition step of forming a thin film pattern using the vapor deposition device of claim 1.

16. A method for producing an organic electroluminescence element comprising a vapor deposition step of forming a thin film pattern on a substrate in a vapor deposition chamber, the vapor deposition step including:
a step of transporting the substrate to a resting position and causing the substrate to rest temporarily at the resting position relative to a vapor deposition unit that includes a vapor deposition mask provided with an opening for pattern formation in the vapor deposition chamber using a transport mechanism; and
a step of forming a vapor-deposited film by transferring at least one of the substrate and the vapor deposition unit relative to the other in a first direction perpendicular to a normal direction of the vapor deposition mask using the transport mechanism,
the substrate including a vapor-deposition-target region, and the substrate being placed such that the region does not overlap the opening of the vapor deposition mask when the substrate is at the resting position, the vapor deposition chamber being provided with a first vent and a second vent, when the substrate is at the resting position, at least part of the second vent being positioned below the substrate in a view in a second direction that is perpendicular to the normal direction and the first direction.

17. The method for producing an organic electroluminescence element of claim 16, wherein the vapor deposition step further includes a step of performing alignment of the substrate and the vapor deposition mask when the substrate is at the resting position.

18. The method for producing an organic electroluminescence element of claim 16, wherein the vapor deposition step further includes a step of stopping the substrate at a stopping position different from the resting position using the transport mechanism after the step of forming a vapor-deposited film.

19. The method for producing an organic electroluminescence element of claim 18, wherein the vapor deposition step further includes a step of forming a vapor-deposited film by transferring at least one of the substrate and the vapor deposition unit relative to the other in the first direction perpendicular to the normal direction of the vapor deposition mask using the transport mechanism after the step of stopping the substrate at the stopping position.

20. The method for producing an organic electroluminescence element of claim 19, wherein the vapor deposition step further includes a step of performing alignment of the substrate and the vapor deposition mask when the substrate is at the stopping position.

* * * * *